(12) United States Patent
Yamaguchi et al.

(10) Patent No.: US 7,061,849 B1
(45) Date of Patent: Jun. 13, 2006

(54) RECORDING METHOD OF OPTICAL DISK, OPTICAL DISK RECORDING APPARATUS, OPTICAL DISK REPRODUCING APPARATUS AND OPTICAL DISK

(75) Inventors: Takeshi Yamaguchi, Sakai (JP); Shigemi Maeda, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 835 days.

(21) Appl. No.: 09/721,469

(22) Filed: Nov. 22, 2000

(30) Foreign Application Priority Data

Nov. 22, 1999 (JP) .......................................... 11-330863

(51) Int. Cl.
*G11B 5/76* (2006.01)

(52) U.S. Cl. .................................. 369/59.23; 369/53.35

(58) Field of Classification Search .............. 369/53.35, 369/59.23, 59.24, 47.15, 47.18, 53.36; 714/746, 714/752, 770, 758
See application file for complete search history.

(56) References Cited

U.S. PATENT DOCUMENTS

| 4,703,408 A | * | 10/1987 | Yonezawa et al. | ........ 369/44.13 |
| 5,333,126 A | * | 7/1994 | Fukuda et al. | ............ 369/59.24 |
| 5,617,384 A | * | 4/1997 | Yonemitsu et al. | ....... 369/30.04 |
| 5,650,984 A | * | 7/1997 | Yamaguchi et al. | ........ 369/30.1 |
| 5,768,298 A | | 6/1998 | Nagai et al. | |
| 6,122,764 A | * | 9/2000 | Kobayashi | ................... 714/758 |
| 6,125,100 A | * | 9/2000 | Sensyu | ..................... 369/275.3 |

FOREIGN PATENT DOCUMENTS

| JP | 63-056875 | 3/1988 |
| JP | 63-061471 | 3/1988 |
| JP | 5-159471 | 6/1993 |
| JP | 07-037335 | 2/1995 |
| JP | 08-007495 | 1/1996 |
| JP | 08-214028 | 8/1996 |
| JP | 08-293161 | 11/1996 |
| JP | 8-293161 | 11/1996 |
| JP | 10-334607 | 12/1998 |
| KR | 1998-063965 | 10/1998 |

OTHER PUBLICATIONS

Office Action from the Korean Patent Office, dated Sep. 25, 2002 with English translation.
Office Action from the German Patent and Trademark Office, dated Nov. 16, 2001 with English translation.

* cited by examiner

*Primary Examiner*—Paul W. Huber
(74) *Attorney, Agent, or Firm*—David G. Conlin; Edwards Angell Palmer & Dodge LLP

(57) ABSTRACT

In a recording method for an optical disk, an optical disk is used, in which concave and convex areas formed as concave and convex sections on the disk substrate are arranged along a track with constant intervals and a recording area for recording data of a predetermined number of units is placed between the concave and convex areas arranged with constant intervals. Upon recording information on this optical disk, a two-dimensional array is formed by adding addition data to input data, a first encoding parity is added to the two dimensional array by carrying out a first encoding process that forms a code sequence by using a data alignment in a diagonal direction, and a second encoding parity is added to the resulting two dimensional array by carrying out a second encoding process that forms a code sequence by using a data alignment in a row direction so that a second two dimensional array is formed. Then, data is successively recorded in the row direction. With this arrangement, it is possible to reduce the occurrence of an incorrectable error in the optical disk in which the recording areas are placed along the track with constant intervals.

28 Claims, 10 Drawing Sheets

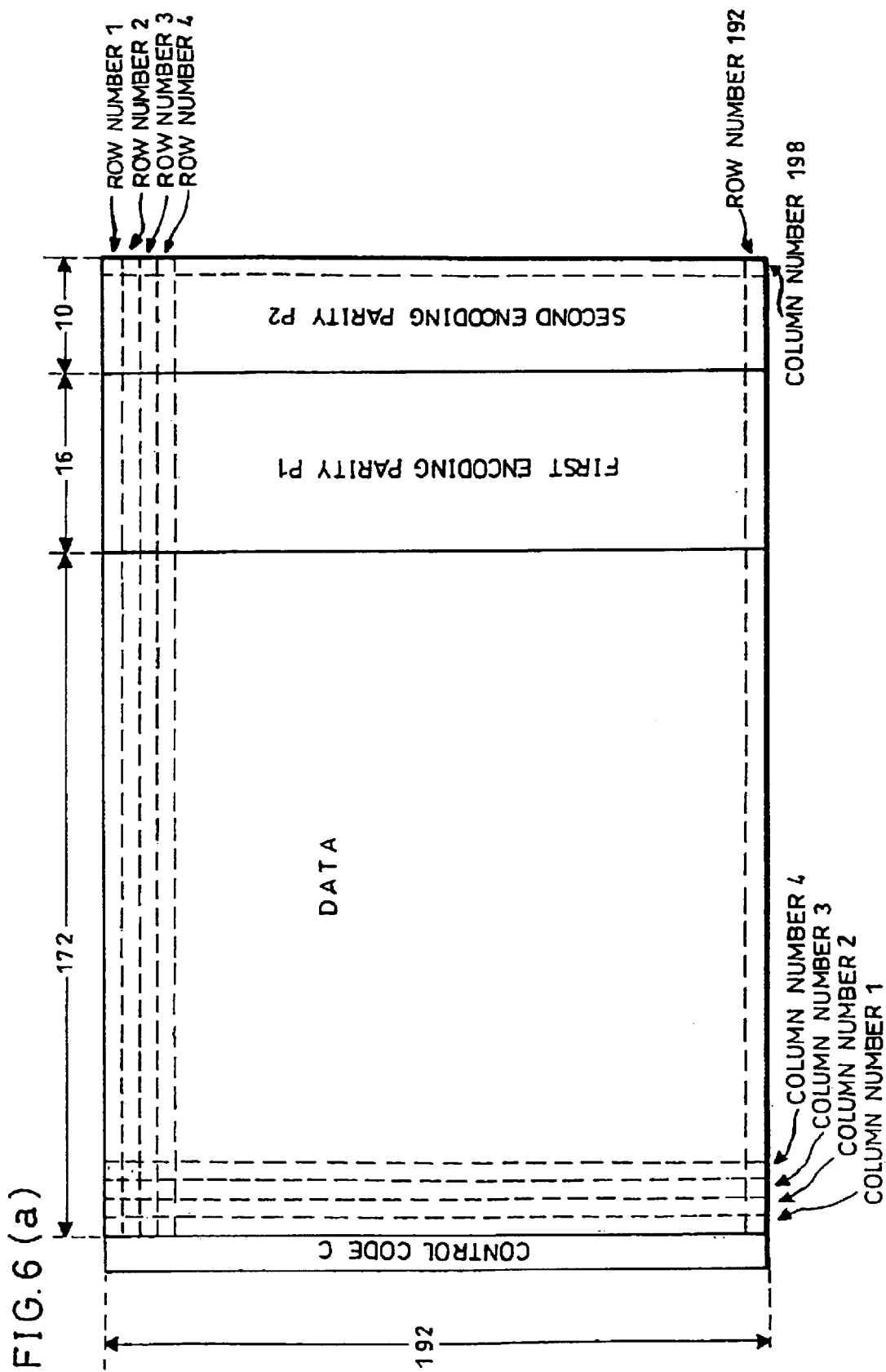

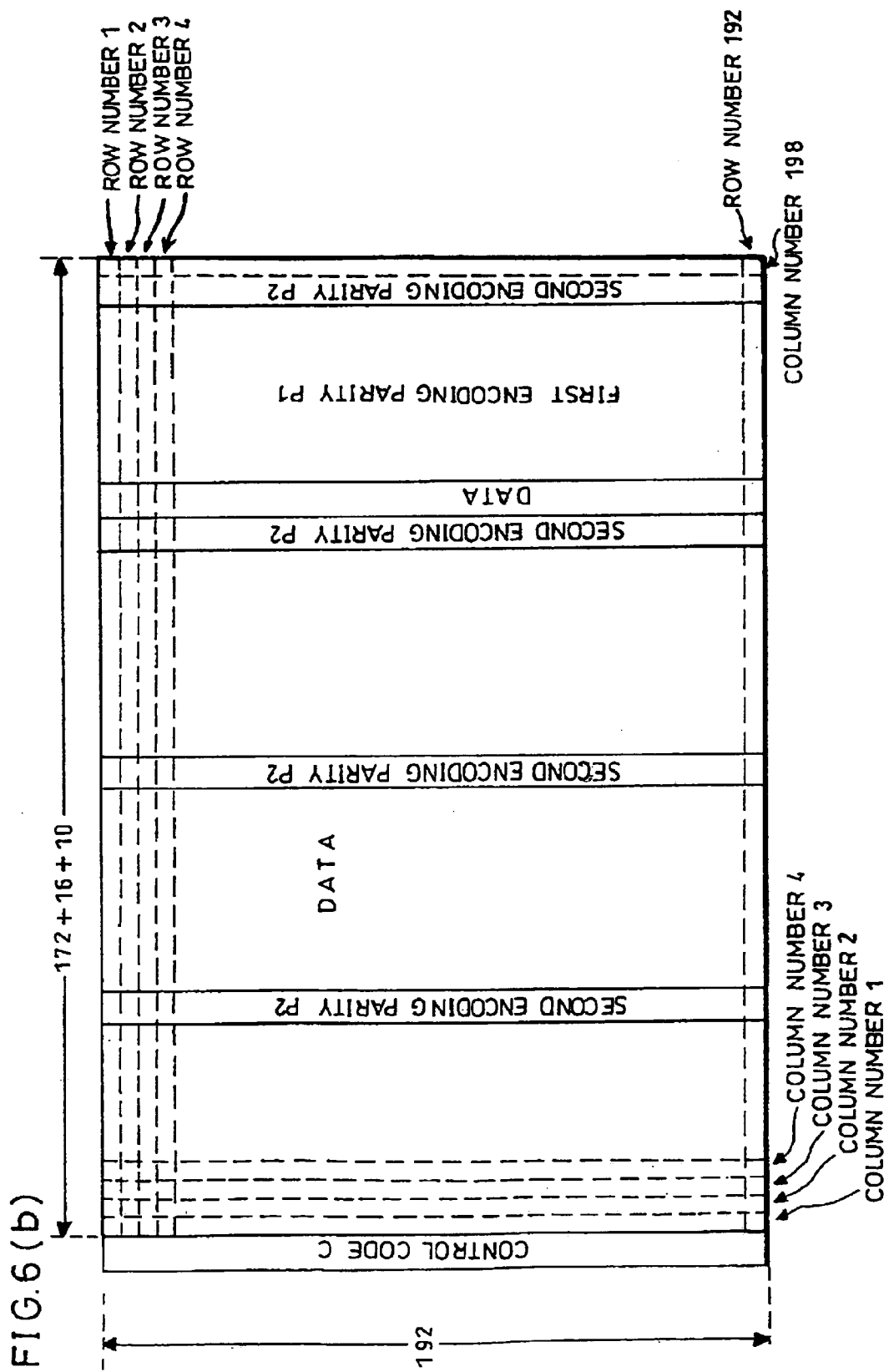

FIG. 9 (a) PRIOR ART
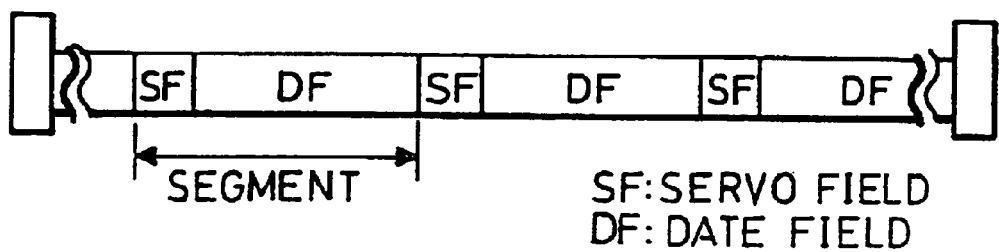
SF: SERVO FIELD
DF: DATE FIELD
FIG. 9 (b) PRIOR ART
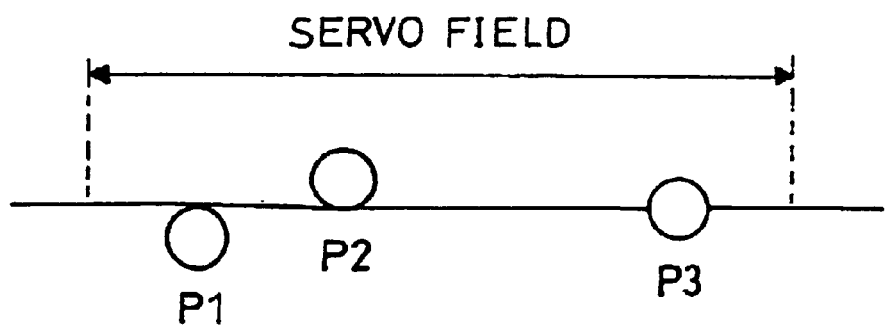

RECORDING METHOD OF OPTICAL DISK, OPTICAL DISK RECORDING APPARATUS, OPTICAL DISK REPRODUCING APPARATUS AND OPTICAL DISK

FIELD OF THE INVENTION

The present invention relates to an optical disk recording method by which data is subjected to an error-correction encoding process, and recorded, an optical disk recording apparatus, an optical disk reproducing apparatus and an optical disk.

BACKGROUND OF THE INVENTION

In an optical disk, an error tends to occur in reproduced data due to a defect in a disk substrate or recording layer and dust and scratches on the surface of a disk substrate. In particular, in recent years, since the recording density has become higher and since the thickness of the disk substrate has become as thin as 0.6 mm, the above-mentioned defect, dust, scratches, etc. are more likely to cause an error.

For this reason, in the optical disk recording and reproducing apparatus, there have been high demands for those apparatuses which have a superior correcting capability in the error-correction encoding process in which an error in data reproduced at the time of disk playback are detected and the erroneous data is restored to correct data. Here, an encoding system in which codes having a great code distance are encoded by doubly combining them has been adopted.

Referring to FIG. 8, an explanation will be given of an example of a recording method for an optical disk recording and reproducing apparatus which includes the above-mentioned double error-correction encoding process. Additionally, this technique is disclosed in Japanese Laid-Open Patent Application No. 293161/1996 (Tokukaihei 8-293161 (published on Nov. 5, 1996).

Main data inputted from a host apparatus in a time sequential manner are divided into 128-byte units, to these further added addition data of two bytes, and these are arranged in 128 rows independently. Data of one byte on the same position (that is, on the same column) are collected from 130-byte data in each row so that a first encoding parity of 14 bytes is added thereto. The first encoding parity is arranged along the direction of arrow Q. The first encoding parity thus arranged consists of 14 rows each having 130 bytes. A second coding parity of 8 bytes is added to each column of 142 rows each having 130 bytes thus arranged.

In this manner, to the appendage data of 2×128 bytes and the main data of 128×128 bytes are added the first encoding parity of 14×130 bytes and the second encoding parity of 8×142 bytes; thus, a two-dimensional array as shown in FIG. 8 is formed. In this two-dimensional array, consecutive 16 rows constitute one logic sector, and one logic sector consists of 128×16=2048 bytes. A sector address is added to each row of the two-dimensional array, and a synchronous signal SYNC is further added thereto.

In this manner, the two-dimensional array in which the correcting process using the first encoding parity and second encoding parity can be concluded is constructed. In the disk, recording is carried out on each row from left to right in FIG. 8, and upon completion of the recording, the next recording is carried out on the row located below.

Here, with respect to data arrangements in the optical disk and the optical disk recording and reproducing apparatus, there have been two systems; that is, a continuous servo system in which recording is made in continuous track areas within a physical sector that is a recording and reproducing unit of user data, and a sample servo system in which recording is made in a discrete manner between a plurality of servo areas arranged on a track by using concave and convex sections formed on the disk substrate within the physical sector.

FIG. 9(a) shows one example of a data mapping state on a track in the sample servo system. As illustrated in this Figure, servo fields (SF), which are servo areas, are arranged on a spiral track with constant intervals in a discrete manner. Data are recorded on a data field (DF) between the adjacent servo fields. The physical sector is constituted by a plurality of collected data segments, each of which is formed by a combination of the servo field and data field. Moreover, an address segment containing address information indicating the position of each physical sector is placed in the data field of the leading segment of the physical sector.

FIG. 9(b) is a conceptual drawing that shows the above-mentioned servo field. As illustrated in this Figure, pairs of pits P1 and P2 which are arranged with predetermined intervals in a biased manner in the disk radial direction with respect to the center of the track and pits P3 arranged in the center of the track are formed on the disk substrate as concave and convex sections. The pits P1 and P2 are used so as to obtain a control signal (tracking error signal) that is used upon scanning a light beam directed from the optical head of an optical disk recording and reproducing along the center of the track. Based upon a difference in the quantities of reflected light beams from the pits P1 and P2 at the time when the light beam scans the track, the tracking error signal is generated. Here, the control signal (focusing error signal), used for converging the light beam on the disk recording surface and for scanning the surface, is generated by using reflected light beam from a mirror face within the servo field.

The pits P3 are used for obtaining a clock signal for specifying the positions of the pits P1 and P2. Moreover, the clock signal is also used as a reference clock (recording and reproducing clock) for reproducing the address information of the address segment and for recording and reproducing data on and from data segments.

In the optical disk shown in FIGS. 9(a) and 9(b), the servo fields are formed as concave and convex sections on the disk substrate; therefore, in the case when the disk substrate is manufactured by extrusion molding, etc., it is highly possible that degradation occurs in the characteristics of the data field portions adjacent to the servo fields. In particular, in the case of magneto-optical disks in which the control for birefringence of the disk substrate is essential, the edge of each data field in the track scanning direction tends to deteriorate in optical properties as compared with the other portion of the data field, resulting in a possible higher data error ratio at the edge of the data field.

Moreover, in the optical disk recording and reproducing apparatus, a reproduced signal, which is obtained when scanning is made by the light beam along the track, becomes discontinuous at the ends of the data fields. For this reason, in a circuit process for converting a reproduced analog signal to a digital signal, deviations tend to occur in the process related to the edge portions of the data fields as compared with processes for the other portions of the data fields, resulting in a high error rate at the ends of the data fields.

Here, the following description exemplifies a case in which information is recorded on the optical disk shown in FIGS. 9(a) and 9(b) by using the recording method as shown in FIG. 8. In this case, when data that are to be recorded on the above-mentioned portions (ends of the data fields) adjacent to the servo fields are concentrated, for example, on the same column in the two-dimensional array in FIG. 8, the first encoding process in the error-correction encoding operation forms a code system on each column in the two-dimensional array; therefore, in the columns on the data field edge portions on which data are concentrated, there is a higher possibility of failure in correction in the decoding process of the error-correcting operation, as compared with the coding system of the first encoding process on the other columns.

Moreover, for the reason as described above, if there is an incorrectable error remaining in a column on which data (user data) are recorded as shown in FIG. 8, it is highly possible that the error causes malfunction in the host apparatus for processing reproduced data from the optical disk recording and reproducing apparatus.

In this manner, in the conventional optical recording method and optical disk recording and reproducing apparatus, in the case when an optical disk that might have a high data error rate particularly in the field ends is reproduced in an optical disk recording and reproducing apparatus, there is a higher possibility of failure in correction in the decoding process of the error-correcting operation and the resulting possibility of malfunction in the host apparatus.

SUMMARY OF THE INVENTION

The objective of the present invention is to provide a recording method for an optical disk which can reduce the occurrence of an incorrectable error in an optical disk in which areas formed as concave and convex sections on the disk substrate are arranged along a track with constant intervals, and also to provide an optical disk recording apparatus, an optical disk reproducing apparatus and an optical disk used in such a method.

In order to achieve the above-mentioned objective, the recording method for an optical disk in accordance with the present invention, which is a recording method for an optical disk in which concave and convex areas formed as concave and convex sections on the disk substrate are arranged along a track with constant intervals and a recording area for recording data of a predetermined number of units n (n: natural number) is placed between the concave and convex areas arranged with constant intervals, is characterized in that: a first two-dimensional array is formed by adding addition data to input data, a plurality of error-correction encoding processes, including at least an error-correction encoding process that forms a code sequence by using a data alignment in a diagonal direction of the first two-dimensional array, are carried out on the first two-dimensional array, a second two-dimensional array is formed in which the length of each row is set to m (m: natural number) with a×m=b×n (a, b: natural numbers) being satisfied, and data on each row in the second two-dimensional array is successively sent so that all the data in the second two-dimensional array is recorded on the recording area on the optical disk.

In accordance with the above-mentioned arrangement, upon recording information on the recording area of the optical disk, the two-dimensional array used in the error-correction encoding process is arranged so that a specific column of data and parity is placed on the ends of a recording area in a concentrated manner, and an error-correction encoding process using a coding system aligned in a diagonal direction of the data array is carried out.

Thus, in the recording area formed by the concave and convex areas on the optical disk substrate, data and parity placed adjacent to the concave and convex areas are dispersed. Therefore, even when an optical disk and an optical disk recording and reproducing device which might have a high error rate at the ends of a recording area adjacent to the concave and convex areas are used, the application of the error-correction decoding process at the time of playback makes it highly possible that the error correction is made, thereby improving the reliability in recording data.

In order to achieve the above-mentioned objective, the recording method for an optical disk in accordance with the present invention, which is a recording method for an optical disk in which concave and convex areas formed as concave and convex sections on the disk substrate are arranged along a track with constant intervals and a recording area for recording data of a predetermined number of units n (n: natural number) is placed between the concave and convex areas arranged with constant intervals, is characterized in that: a first two-dimensional array is formed by adding addition data to input data, a single error-correction encoding process or a plurality of error-correction encoding processes which form code sequences by using data alignments in respectively different directions of the first two-dimensional array are carried out on the first two-dimensional array so that a second two-dimensional array is formed; thus, data on the respective rows in the second two-dimensional array are successively sent while exchanging the data so as to record parity generated in at least any one of the error-encoding processes on the portions adjacent to the concave and convex areas in the recording area, thereby recording all the data in the second two-dimensional array on the recording area on the optical disk.

In accordance with the above-mentioned arrangement, upon recording information on the recording area of the optical disk, parity is placed on the ends of the recording area adjacent to the concave and convex areas of an optical disk substrate.

With this arrangement, no data to be recorded is located on the ends of the recording area adjacent to the concave and convex areas of an optical disk substrate. Therefore, even when an optical disk which might have a high error rate at the ends of a recording area adjacent to the concave and convex areas is used and an optical disk recording and reproducing apparatus has a failure in correcting an error, it is possible to reduce an error occurring in important data sent from the host apparatus.

Here, the optical disk in accordance with the present invention is an optical disk on which information is recorded by the above-mentioned recording method for an optical disk. Moreover, the optical disk recording apparatus of the present invention uses the above-mentioned recording method for an optical disk so as to record information on the optical disk. Furthermore, the optical disk reproducing apparatus of the present invention reproduces information from the optical disk on which information has been recorded by using the above-mentioned recording method for an optical disk.

Additionally, Japanese Laid-Open Patent Application No. 293161/1996 (Tokukaihei 8-293161) discloses a method in which: a collection of recorded data is arranged two-dimensionally, a second encoding process is carried out in a diagonal direction in the two-dimensional array, and a first encoding process is carried out in the horizontal direction (forward direction in the disk recording).

However, different from the present invention, the above-mentioned reference does not disclose anything about the relationship between data recording positions on the disk and areas formed as concave and convex sections on the track. The above-mentioned reference of course does not disclose anything about the arrangement in which data and parity are rearranged so that the parity is located in the vicinity of areas formed as concave and convex sections on the track.

Moreover, Japanese Laid-Open Patent Application No. 159471/1993 (Tokukaihei 5-159471 (published on Jun. 25, 1993) has defined the relationship between the disk format (the data length p of the area sandwiched between the concave and convex sections on the disk track) and the interleave factor q so that with respect to areas formed as concave and convex sections on the disk track, errors do not concentrate on a single error-correction coding sequence. In other words, this reference discloses that the format and the interleave factor are set in such a manner that "p is not divided by q or a divisor of q".

In contrast, in the invention of the present application, for example, in FIG. 1, p=50 and q=200 are set so that "p is divided by a divisor of q". In other words, the present invention is not intended to provide the arrangement in which the relationship between the data length p of the area sandwiched between the concave and convex sections on the disk track and the interleave factor q is defined so that errors do not concentrate on a single error-correction coding sequence.

The above-mentioned difference is derived from a distinction in the basic error-correction block structure. In other words, in the above-mentioned reference, the error-correction encoding process is carried out in the perpendicular direction of the two-dimensional array, and the horizontal direction of the two-dimensional array is set as the disk recording forward direction. In contrast, in the present invention, the second encoding process is carried out in a diagonal direction of the two-dimensional array, and the horizontal direction of the two-dimensional array is set as the disk recording forward direction. Moreover, the above-mentioned reference does not disclose anything about the arrangement in which data and parity are rearranged so that parity is located in the vicinity of the areas formed as concave and convex sections on a disk track.

For a fuller understanding of the nature and advantages of the invention, reference should be made to the ensuing detailed description taken in conjunction with the accompanying drawings.

BRIEF DESCRIPTION OF THE DRAWINGS

FIG. 3($b$) is an explanatory drawing that shows a servo field of the magneto-optical disk.

FIG. 6($a$) is an explanatory drawing that shows an error correction method in accordance with another embodiment of the present invention.

FIG. 6($b$) is an explanatory drawing that shows an error correction method in accordance with still another embodiment of the present invention.

FIG. 9($a$) is an explanatory drawing that shows a segment layout of an optical disk of a sample servo system.

FIG. 9($b$) is an explanatory drawing that shows a servo field of an optical disk of a sample servo system.

DESCRIPTION OF THE EMBODIMENTS

[Embodiment 1]

Referring to FIGS. 1 through 5, the following description will discuss an optical disk recording method and an optical disk recording and reproducing apparatus in accordance with Embodiment 1.

Figure 2:
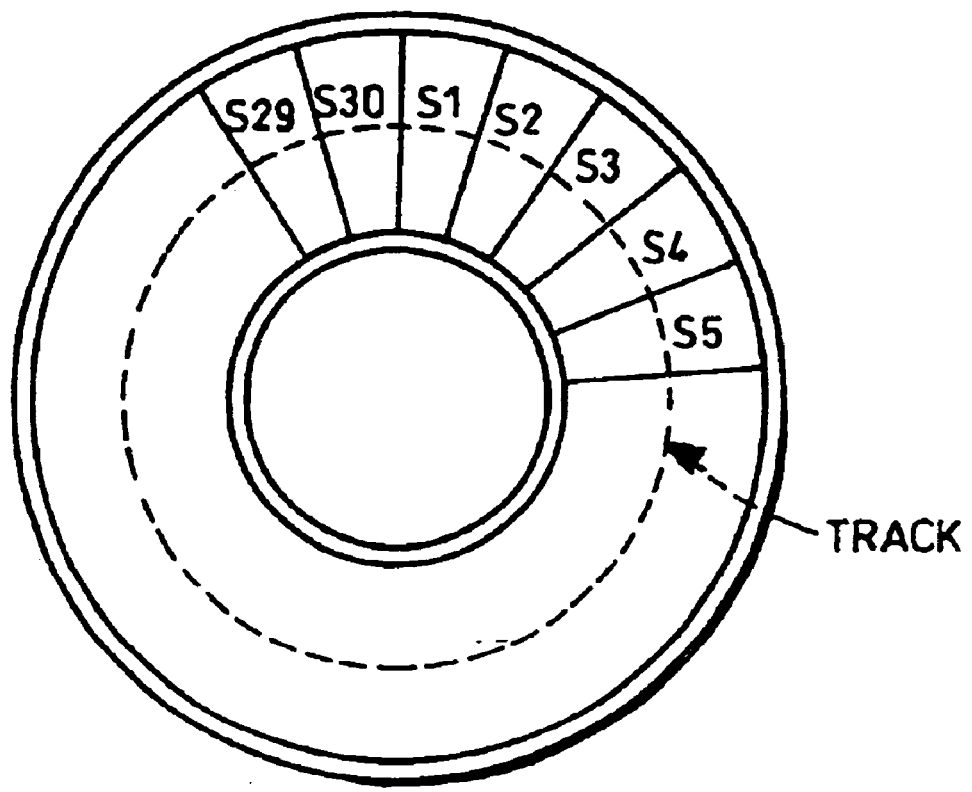
FIG. 2 is an explanatory drawing that shows a track in a magneto-optical disk.

FIG. 2 is an explanatory drawing of an optical disk to which the recording method of the present Embodiment is applied. The optical disk shown in FIG. 2 is a magneto-optical disk having a track format of a sample servo system. One circuit of the spiral track of this magneto-optical disk is divided into 30 physical sectors (frames).

Figure 3:
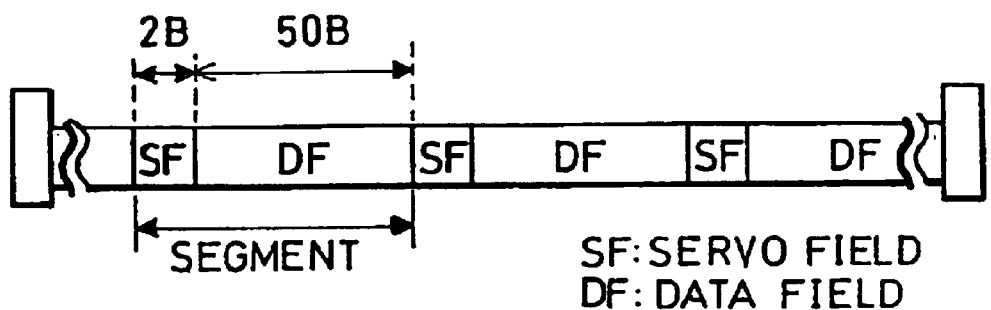
FIG. 3($a$) is an explanatory drawing that shows segment layout of the magneto-optical disk.
Figure 3:
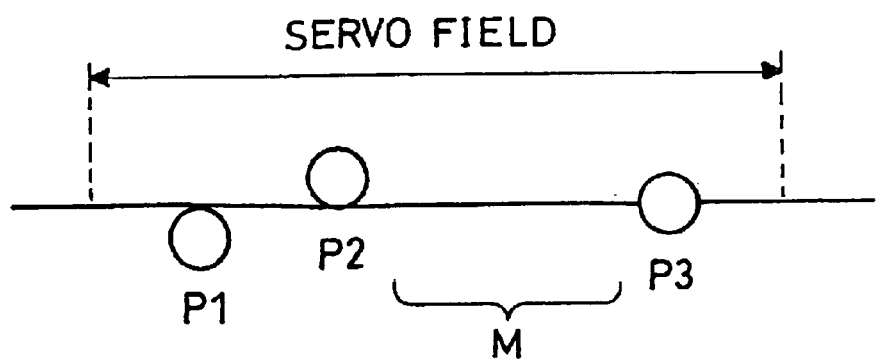

FIG. 3($a$) is an explanatory drawing that shows the layout of segments on the track of the optical disk. Each segment consists of a data field DF on which a servo field SF having a length corresponding to 2 bytes and data of 50 bytes are recorded. Therefore, in FIG. 3($a$), data of 50 bytes are recorded between areas (servo fields SF) formed as concave and convex sections on the substrate. Here, each frame consists of 48 data segments on which data are recorded and 2 address segments on which address information is preliminarily formed.

FIG. 3($b$) is a conceptual drawing that shows the servo field SF of FIG. 3($a$). As illustrated in FIG. 3($b$), pairs of pits P1 and P2 which are arranged with predetermined intervals in a biased manner in the disk radial direction with respect to the center of the track and pits P3 arranged in the center of the track are formed on the disk substrate as concave and convex sections. Based upon a difference in the quantities of reflected light beams from the pits P1 and P2 at the time when the light beam scans the track, the tracking error signal is generated. Here, the control signal (focusing error signal), used for converging the light beam on the disk recording surface and for scanning the surface, is generated by using reflected light beam from a mirror face within the servo field SF.

The pits P3 are used for obtaining a clock signal for specifying the positions of the pits P1 and P2. Moreover, the clock signal is also used as a reference clock (recording and reproducing clock) for reproducing the address information of the address segment and for recording and reproducing data on and from data segments.

Figure 1:
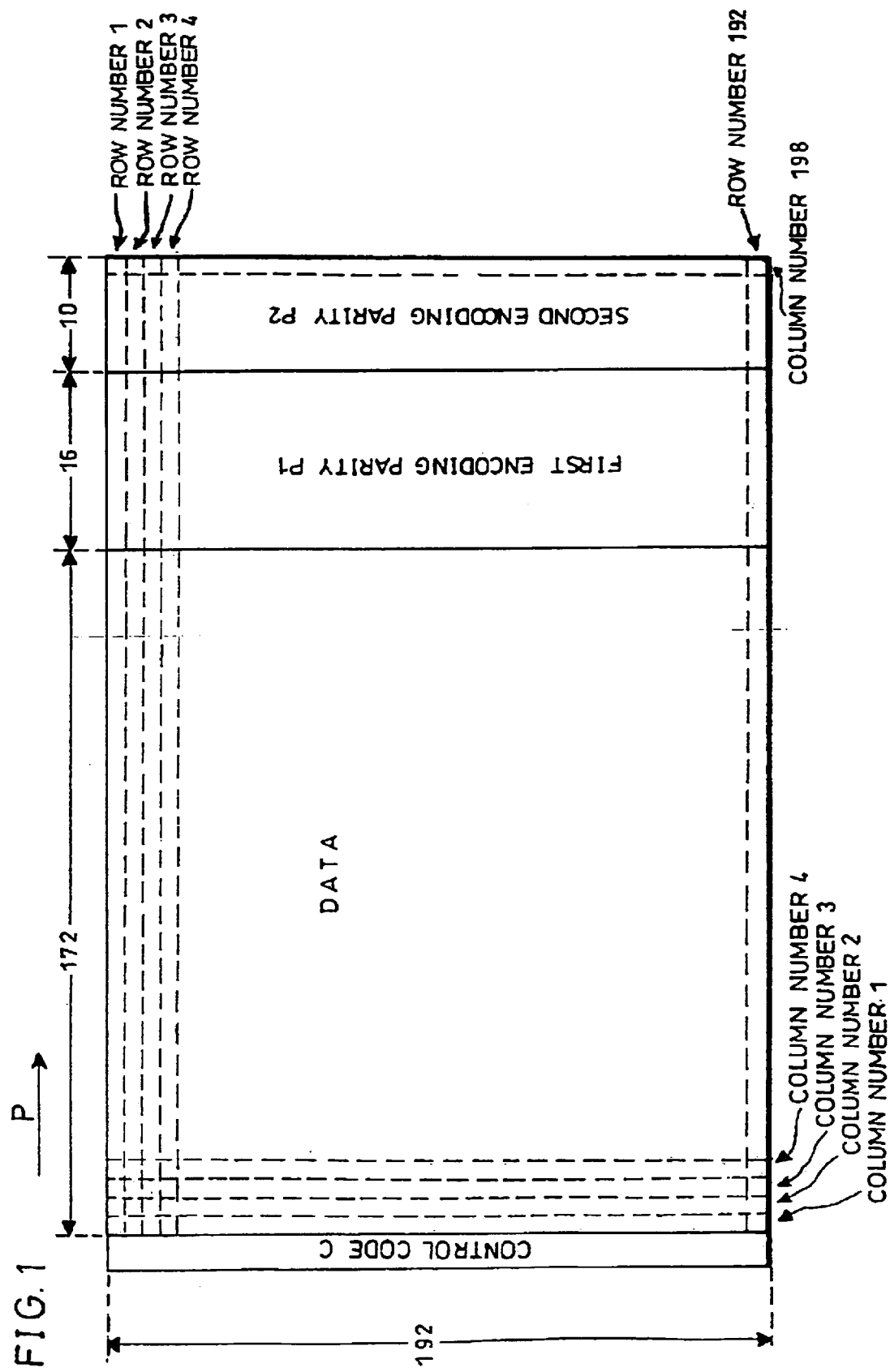
FIG. 1 is an explanatory drawing that shows an error correction method in accordance with one embodiment of the present invention.

FIG. 1 is an explanatory drawing that shows an information recording method (error-correction sequence) of a magneto-optical disk shown in FIG. 2 and FIGS. 3($a$) and 3($b$). FIG. 1 shows a structure of a data block that is a unit of an error-correction coding process.

Here, an explanation will be given of a case in which: user data to be recorded on one logical sector, which is a recording and reproducing unit that is specified by the host apparatus, are set to 2048 bytes, and addition data (attached data indicating characteristics, etc. of the user data, error correction codes for user data, etc.) that are added to the user data of one logical sector by the optical disk recording and reproducing apparatus are set to 16 bytes, and the total 2064 bytes are arranged in a two-dimensional array (172 bytes×12 bytes) as one unit.

First, data corresponding to 16 logical sectors and addition data are arranged in one row consisting of data of 172 bytes in a direction of data flow (arrow P in FIG. 1: recording direction) and 192 rows are (virtually) placed in a direction orthogonal to the direction of the row so that a two-dimensional array of data blocks (first two-dimensional array) (172 bytes×12 bytes×16)=(172 bytes×192 bytes) is formed.

Successively, a first encoding parity P1 and a second encoding parity P2 are added to the data arranged in the two-dimensional array based upon two error-correction sequences.

The first encoding parity P1 is prepared as a parity of 16 bytes obtained as a result of an encoding process that is carried out on a data alignment in a diagonal direction (in a direction in which as one advance is made in the row direction, one drop is made in the column direction) by using a Reed-Solomon code with a code minimum distance of 17.

The first encoding parity P1 is added to a position on an extended line in the diagonal direction of the two-dimensional array. In FIG. 1, the position of each data in the two-dimensional array is indicated as (row number, column number) by using row number 1, 2, . . . , 192 assigned to each row in the lateral direction and column number 1, 2, . . . , 172 assigned to each column in the longitudinal direction. In this case, the coding sequence in the first encoding process is constituted by, for example, respective data with data positions (1, 1), (2, 2), (3, 3), . . . (172, 172) and respective parities with data positions (173, 173), (174, 174), . . . (188, 188).

Moreover, as described above, in the case when the code sequence is constituted by data and parities successively located at data positions in the diagonal direction starting with the leading data position of the rows, if the lowermost row has been reached before reaching the encoding length of 188 bytes, the sequence returns to the uppermost row, and a coding sequence is again formed by using data and parities successively located at a data position in the diagonal direction.

The application of the first encoding parity P1 makes it possible to correct errors up to 8 symbols occurring randomly in the coding sequence in the diagonal direction.

The second encoding parity P2 is prepared as a parity of 10 bytes obtained as a result of an encoding process that is carried out on each row in the lateral direction in a two-dimensional array (third two-dimensional array) (188 bytes×192 bytes) that has been subjected to the first encoding process by using a Reed-Solomon code with a code minimum distance of 11. The second encoding parity P2 is added to positions on an extended line in the row direction in the two dimensional array. Thus, the second encoding process forms two-dimensional array (198 bytes×192 symbols).

The application of the second encoding parity P2 makes it possible to correct errors up to 5 symbols occurring randomly in the coding system in the lateral direction.

Moreover, a control code C (attached code) indicating the row number, etc. in the two-dimensional array is added to the leading portion of each row in the two-dimensional array (198 bytes×192 bytes) to which the first and second encoding parities P1 and P2 have been added. Here, the control code C is a code that is not directly related to the user data.

The addition of the control code C forms a two-dimensional array (second two-dimensional array) of 200 bytes×192 bytes. Since this description exemplifies a case in which, as illustrated in FIG. 3(a), data are recorded in a data field DF of 50 bytes, in the above-mentioned two-dimensional array, recording data (user data, addition data and first and second encoding parities) corresponding to 4 data segments are contained in each row.

Then, as described above, the recorded data, arranged in the two-dimensional array, are divided into 4-data segments at the time of recording. Moreover, data (user data, addition data), parities (first encoding parity P1, second encoding parity P2) and control code C, which correspond to 12 rows, are recorded on one frame sequentially in the direction of arrow P from up to down.

In a magneto-optical disk having the above-mentioned recording format, recording data of integral multiples (in this case, 4) of the data segment are included in each row in the two-dimensional array. Therefore, data that are to be placed at an end of the data field DF of each data segment in FIG. 3(a) are given as data placed at the leading control code of each row and data placed at column numbers 48, 49, 98, 99, 148, 149 and 198 (where column numbers are allocated to the portion other than the control code C). Therefore, the data to be placed at the end of the data field are concentrated on specific columns in the two-dimensional array.

In the present Embodiment, the coding sequence of the first encoding process is formed by using a data alignment in a diagonal direction in the two-dimensional array, and no coding sequence is formed with respect to the data alignment in the column direction. Therefore, even when a optical disk and an optical disk recording and reproducing apparatus which might have a high error rate at the ends of a recording area are used, it is possible to prevent errors from concentrating on a specific code sequence, and consequently to disperse them over some code sequences. Therefore, upon reproducing the data, the possibility of errors being corrected by the error-correction decoding process becomes higher, thereby making it possible to ensure the reliability of the recording data.

Here, in the present embodiment, data corresponding to 16 logical sectors (32768 bytes) and addition data are arranged as a two-dimensional array (172 bytes×192 bytes). This setting is made as follows: The number of rows of the two-dimensional array (188 bytes×192 bytes) to which the first encoding parity P1 has been added through the first encoding process is set to a maximum number of integral multiples of the number of logical sectors, that is, 16, within a range not allowing the length in the lateral direction (the number of data contained in one row=188) to exceed the length in the longitudinal direction (the number of rows= 192).

With this arrangement, in the coding sequences of the first encoding process, it becomes possible to form data and parities contained in one coding sequence by using data and parities derived from respectively different rows. Therefore, it is possible to provide an effective interleaving process and also to increase the encoding efficiency.

Moreover, one logical sector is designed so as to be contained in an array with as small as 12 rows; therefore, data belonging to a plurality of logical sectors are not placed on the same row, thereby making it possible to carry out a recording or reproducing process on a logical sector basis. Moreover, it is possible to provide a better correlation with the physical sectors actually recorded on a disk.

In the case when a control code C of two bytes is inserted into each row so that recording data of integral multiples of the data segment are just contained in each row, the number of bytes of the control code C needs to be changed depending on the number of user data, the number of data in each data segment, etc. Additionally, the control code C is preferably arranged so that at least one portion thereof is located at an end of the data field DF that is comparatively low in the data reliability; thus, it is possible to reduce the probability of the user data being placed at the end portions.

In contrast, in the case when the control code C is not added, for example, the number of data in each data segment is arranged so that data of integral multiples of the data segment is just contained in each row. In the case of the above-mentioned example, if the number of data in each data segment is 49.5 bytes, then the arrangement is made so that data of integral multiples of the data segment are just contained in each row, without the need for the addition of the control code C.

As described above, in the present embodiment, supposing that the number of data in the data field DF between the concave and convex areas (servo fields SF) is n bytes (n: natural number), all the data including the user data, addition data, the first encoding parities, the second encoding parities and control node C, added on demand, are arranged as a two-dimensional array in which the length of each row m is represented by b×n (b: natural number). In other words, provision is made so that data that are to be recorded at ends of the data field DF are concentrated on specific rows. In addition to this arrangement, one of the error-correction encoding processes is carried out by using a code sequence constituted by a data alignment in the diagonal direction in the two-dimensional array; thus, it is possible to avoid errors from concentrating on specific coding sequences. Therefore, upon reproducing data from the above-mentioned magneto-optical disk recording and reproducing apparatus, the possibility of the data being corrected by the correction decoding process becomes higher, thereby improving the reliability of the recording data. Here, in the above-mentioned example, the first code sequence is constituted by a data alignment in a diagonal direction; however, a data alignment in any direction may be used as long as the data alignment in the longitudinal direction is not used.

In order to arrange the data to be recorded on ends of the data field DF so as to be concentrated on specific columns, the length m of each row may be represented by b×n=a×m (a: natural number). Here, in an attempt to allow data related to one logical sector to complete within a plurality of rows, that is, to prevent data related to one logical sector from being placed on the same row, supposing that the number of data related to one logical sector is l bytes (l: natural number greater than m), l=c×m (c: natural number) needs to be satisfied. In this case, the data corresponding to one logical sector is completed within c rows. Moreover, supposing that the minimum combination of a and b that satisfies b×n=a×m are $a_{min}$ and $b_{min}$, it is preferable to set $a_{min}$ to a divisor of c that is smaller than c. With this arrangement, in the data arrangement corresponding to one logical sector, it is possible to provide a specific row bearing a plurality of data to be recorded on ends of the data field DF, and consequently to obtain the effects of the recording method of the present embodiment.

Figure 4:
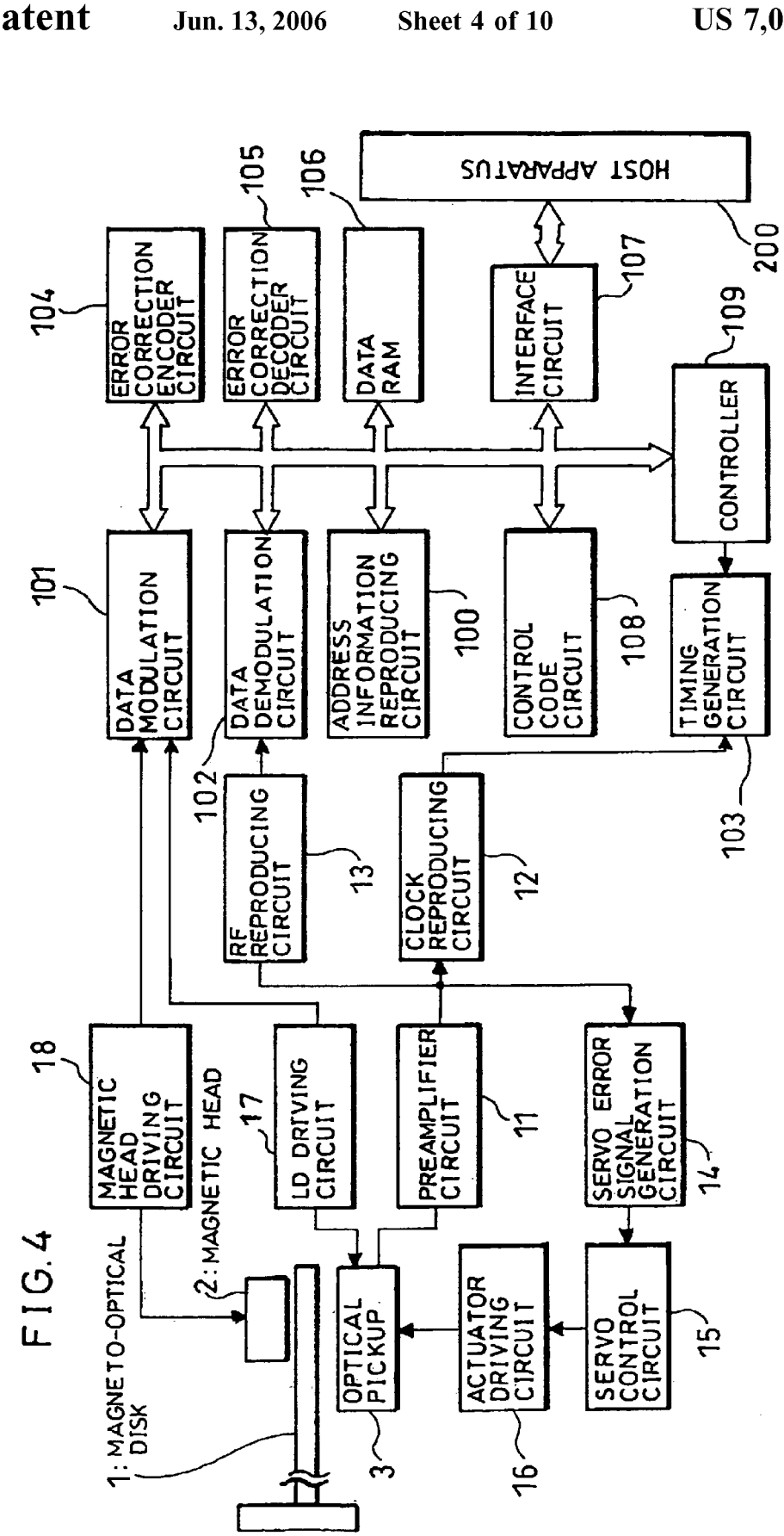
FIG. 4 is a block diagram that schematically shows the structure of a magneto-optical disk recording and reproducing apparatus in accordance with each embodiment of the present invention.

Next, an explanation will be given of an example of a recording and reproducing apparatus that achieves the above-mentioned recording method. FIG. 4 is a block diagram that shows a schematic construction of the magneto-optical disk recording and reproducing apparatus.

As illustrated in FIG. 4, the magneto-optical disk recording and reproducing apparatus is constituted by: a magneto-optical disk 1, a magnetic head 2, an optical pickup 3, a preamplifier circuit 11, a clock reproducing circuit 12, a RF reproducing circuit 13, a servo error signal generation circuit 14, a servo control circuit 15, an actuator driving circuit 16, an LD driving circuit 17, a magnetic head driving circuit 18, an address information reproducing circuit 100, a data modulation circuit 101, a data demodulation circuit 102, a timing generation circuit 103, an error correction encoder circuit (ECC-ENC) 104, an error correction decoder circuit (ECC-DEC) 105, a data RAM (memory) 106, an interface circuit (I/F) 107, a control code circuit 108, a controller 109 and a host apparatus 200.

The magneto optical disk 1 is driven to rotate at a constant angular velocity (CAV) by a disk rotation motor and the control circuit (both of which are not shown). A light beam, outputted from the optical pickup 3 is allowed to scan a track on the magneto-optical disk 1.

As illustrated in FIG. 3(b), when a light beam is directed to pairs of pits P1 and P2 (tracking pits P1 and P2) which are arranged with predetermined intervals in a biased manner in the disk radial direction with respect to the center of the track within a servo field SF in the sample servo system, voltage values, which vary in response to quantities of light beams reflected from the tracking pits, are outputted from a photodetector within the optical pickup 3. Moreover, when a light beam is directed to a mirror face M between the pit P2 and pit P3, the optical pickup 3 is allowed to output a voltage value that varies in response to the degree of focusing onto the disk recording face (the amount of offsets in focusing) that is measured by optical members and the photodetector (not shown) placed in the optical pickup 3. Moreover, in the case when an optical beam is directed onto the pit P3 inside the servo field SF, a voltage value, which varies in response to a quantity of light beam reflected from the pit P3, is outputted from the photodetector.

These output signals from the optical pickup 3 are connected to the preamplifier circuit 11, and amplified to appropriate signal levels. The output from the preamplifier circuit 11 is inputted to the servo error signal generation circuit 14, at which the inputted signal is sampled and calculated in synchronized timing with the pits P1 and P2 and the mirror face M so that a tracking error signal and a focusing error signal, which are servo error signals, are generated. Here, it has been known in the art that in the sample servo system, the tracking error signal is generated based upon a difference between the quantities of reflected light beams from the pits P1 and P2. Moreover, with respect to the generation of the focusing error signal, for example, an astigmatic aberration method has been known.

The above-mentioned tracking error signal and focusing error signal are connected to the servo control circuit 15. In the servo control circuit 15, these error signals are subjected to an amplification process so as to be controlled to predetermined servo gains, and also to a servo phase compensating process so as to ensure servo stability. Then, the output of the servo control circuit 15 is connected to the actuator driving circuit 16 in which it is converted to a signal for driving the objective lens actuator within the optical pickup 3.

Moreover, the output of the preamplifier circuit 11 is connected to the clock reproducing circuit 12, at which a pulse indicating the output position of the pit 3 is generated and a clock signal corresponding to the recording and reproducing bit rate based upon the pulse is generated. Here, it has been known that a phase locked loop circuit (PLL circuit) is used for generating the clock signal. Moreover, the clock signal outputted from the clock reproducing circuit 12 is connected to the timing generation circuit 103. The timing generation circuit 103 generates the tracking error signal, the focussing error signal, and timing signals that are required for data recording and reproducing.

FIG. 4 shows a magneto-optical disk recording and reproducing apparatus of the magnetic field modulation recording type. Therefore, the magnetic head driving circuit 18 supplies to the magnetic head 2 a driving signal (electric current) for inverting the external magnetic field to be applied to the magneto-optical disk 1 in accordance with channel bit strings outputted from the data modulation circuit 101. Moreover, the LD driving circuit 17 for driving the semiconductor laser within the optical pickup 3 controls the intensity of light beam outputted at the time of reproducing signals from the magneto-optical disk 1 or at the time of recording signals thereon so as to be maintained at an intensity suitable for the reproducing or recording process.

The RF reproducing circuit 13 to which the output of the preamplifier circuit 11 is connected subjects a signal obtained when a light beam scans the data field DF (FIG. 3(a)) of the sample servo system to a filtering process for reducing noise, a waveform equalization process for compensating for a reduction in the resolution in frequency bands occurring depending on the sizes of the light beam and a conversion process to a digital signal; thus, the resulting reproduced digital signal is outputted to the data demodulation circuit 102 and the address information detection circuit 100.

The address information detection circuit 100 detects address information stored in the address segments formed on a track on the magneto-optical disk from channel bit strings of the reproducing digital signal.

Next, an explanation will be given of the processing of recording and reproducing data that constitutes features of the present invention. Here, for convenience of explanation, it is assumed that the host apparatus 200 gives a recording or reproducing instruction to the magneto-optical disk recording and reproducing apparatus with respect to 16 logical sectors constituting an error correction block as one unit. Then, an explanation will be given of a case in which data corresponding to logical sectors of integral multiples of 16 starting with the first logical sector of the 16 logical sectors constituting the error correction block are recorded or reproduced.

(1) Data Processing at the Time of Data Recording

First, upon receipt of an instruction for recording from the host apparatus 200, the controller 109 temporarily stores user data (2048 bytes) having a size of one logical sector, sent through the interface circuit 107, in the data RAM 106. Moreover, the controller 109 also additionally stores addition data of 16 bytes to be added to the user data in the data RAM 106.

Here, with respect to the data arrangement within the data RAM 106, it is simplest to use an arranging method in which the two-dimensional array of recording format shown in FIG. 1 is realized on the data RAM 106. Therefore, it is assumed that a controlling operation is carried out based upon the data arrangement having the above-mentioned recording format.

Figure 5:
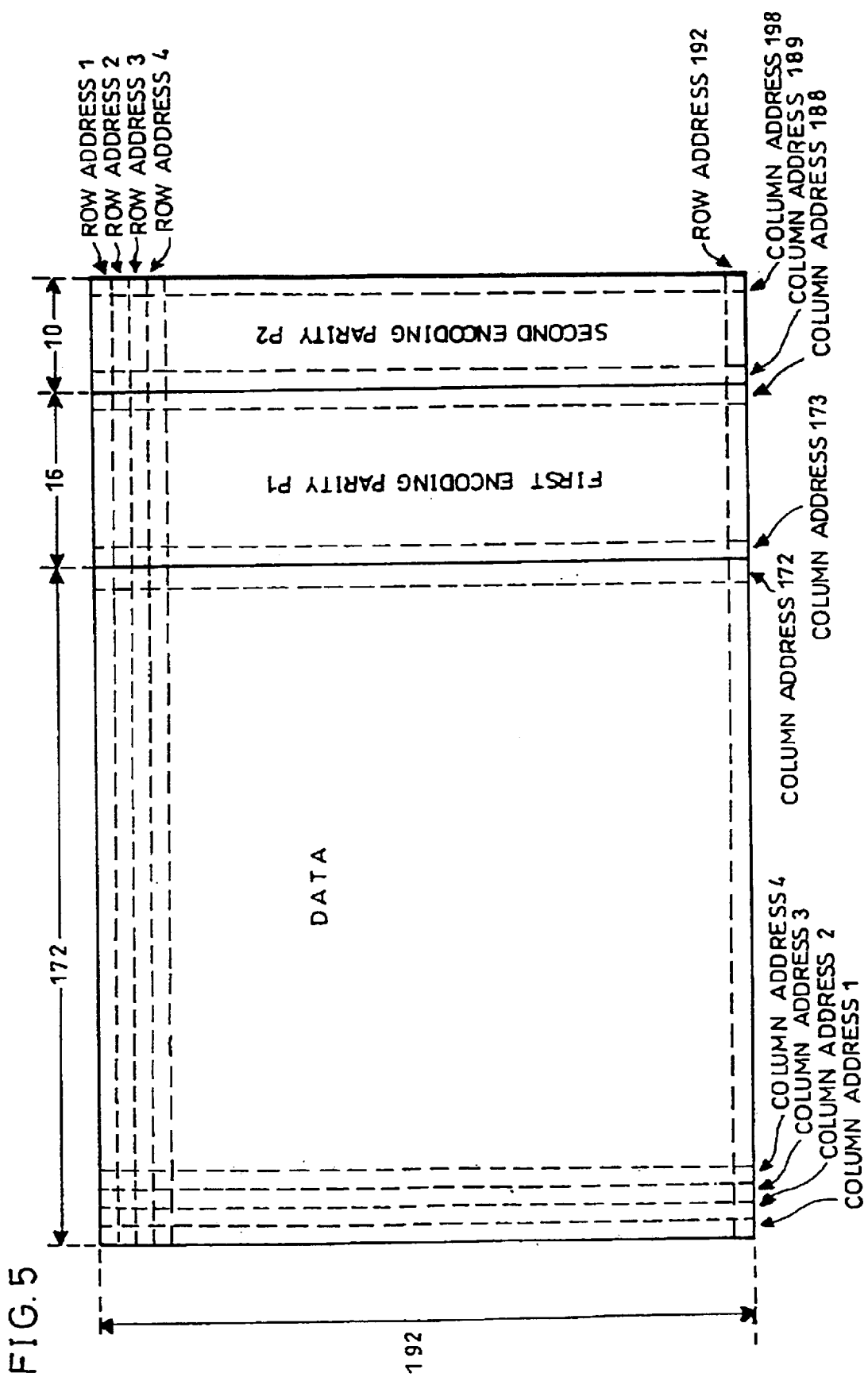
FIG. 5 is an explanatory drawing that schematically shows a data layout on a data RAM of the magneto-optical disk recording and reproducing apparatus shown in FIG. 4.

FIG. 5 is an explanatory drawing that schematically shows the data arrangement on the data RAM 106. As illustrated in FIG. 5, the data RAM 106 at least has a memory space consisting of row addresses of 1 to 192 and column addresses of 1 to 198 that correspond to the recording format of FIG. 1. The user data and addition data corresponding to one logical sector are arranged in the row addresses 1 to 12 and the column addresses of 1 to 172 of the data RAM 106 (a data storage area corresponding to the first logical sector of 16 logical sectors).

The controller 109 repeatedly carries out reception of the user data from the host apparatus 200, storage thereof into the data RAM 106 and additional recording of the addition data to the RAM 106 for data of 16 logical sectors, thereby arranging the corresponding data in the row addresses 1 to 192 and the column addresses 1 to 172.

Next, the controller 109 controls the data RAM 106 and the error correction encoder circuit (encoding means) 104 so that the user data and addition data, stored in the data RAM 106, are subjected to error-correction encoding processes.

In the first encoding process, the controller 109 is allowed to read 172 bytes of the data in a diagonal direction based upon a data position (row address, column address)=(1, 1) serving as a base point of the two-dimensional array indicated by the row address 1 to 192 and the column addresses 1 to 172, and transmits the resulting data to the error-correction encoder circuit 104. The error-correction encoder circuit 104 carries out an encoding process by using a Reed-Solomon code with a code minimum distance of 17 on the above-mentioned data, and parities of 16 bytes, thus generated, are recorded on the data RAM 106 in a diagonal direction along an extended line from the two-dimensional array. In other words, the parities to be respectively applied to the data located at data positions (1, 1), (2, 2), (3, 3), . . . , (172, 172) are recorded at data positions (173, 173), (174, 174), . . . , (188, 188). Thereafter, based upon the data positions (2, 1), (3, 1), . . . , (192, 1) serving as reference points on the data RAM 106, the controller 109 read data of 172 bytes in the diagonal direction respectively, and transmits the resulting data to the error-correction encoder circuit 104.

In this manner, the error-correction encoder circuit 104 carries out an encoding process for every 172 bytes thus transmitted, and records the generated parities on the data RAM 106. Here, in the data reading process and parity recording process that are successively carried out on the data positions diagonally from the leading row data positions (2, 1), (3, 1), . . . , (192, 1), if the sequence reaches the row address 192 on the lowermost stage before it has achieved the coding length of 188 bytes, then the sequence thereafter returns to the row address 1 on the uppermost stage, and continues the data reading and parity recording processes in the diagonal direction.

Upon completion of the first encoding process, the second encoding process is then carried out. The controller 109 reads the respective data of 172 bytes on the row address 1 and the first encoding parities of 16 bytes of the data RAM 106, and transmits the resulting data to the error-correction encoder circuit 104. The error-correction encoder circuit 104 carries out an encoding process by using a Reed-Solomon code with a code minimum distance of 11 on the above-mentioned data, and parities of 10 bytes, thus generated, are recorded at row addresses of 189 to 198 on the data RAM 106. Thereafter, with respect to each row of the row addresses on 2, 3, . . . , 192 on the data RAM 106, the controller 109 reads the data of 172 bytes and the first encoding parities of 16 bytes, and transmits the resulting data to the error-correction encoder circuit 104. The error-correction encoder circuit 104 carries out the encoding process for every 188 bytes thus transmitted, and records the generated parities in the data RAM 106.

As described above, with respect to the data and parities within the data RAM 106 that have been subjected to the first and second error encoding processes, the controller 109 controls and sends the above-mentioned data and parities to the data modulation circuit 101, in order to record them in frames corresponding to the logical sector specified by the host apparatus 200.

With respect to the data and parities corresponding to 16 logical sectors stored in the data RAM 106, when the address information reproducing circuit 100 detects an arrival of a frame corresponding to the first logical sector, the controller 109 controls the control code circuit 108 so that a control code of 2 bytes is sent to the data modulation circuit 101. Here, the control code contains a code indicating the row number 1 in the two-dimensional array that constitutes an error correction block.

Next, the controller 109 sends data and parities of 198 bytes corresponding to the row address 1 on the data RAM 106 to the data modulation circuit (modulation means) 101. The data modulation circuit 101, which is controlled by the controller 109, divides into four the control code (2 bytes) corresponding to each row in the two-dimensional array of the error correction block and the data and parities (198 bytes), and subjects these to a data modulation process on a basis of 50 bytes; thus, the resulting recording data bit strings are sent to the magnetic head driving circuit 18 (recording means) so as to be recorded in data fields within the four data segments following the address segment of the frame corresponding to the first logical sector.

Thereafter, the controller 109 controls the control code circuit 108 and the data RAM 106 so that it successively sends the control codes corresponding to the row numbers 2, 3, . . . , 12 in the two-dimensional array constituting the error correction block stored in the data RAM 106 and data as well as parities to the data modulation circuit 101. The data modulation circuit 101 divides the control code, data and parities on a data field basis, and carries out a modulation process thereon, thereby sending the resulting recording channel bit strings to the magnetic head driving circuit 18.

With respect to the second logical sector of the 16 logical sectors and thereafter, the above-mentioned processes, including the transmitting process of the corresponding control code, the transmitting process of the corresponding data and parities within the data RAM 106 and the data modulating process, are repeated so that the data process related to one error correction block is completed.

Moreover, in the case when the logical sectors which have to be recorded according to the instruction from the host apparatus 200 still remain, the above-mentioned processes, related to the error correction blocks carried out on a basis of 16 logical sectors, are repeated so that the data processing corresponding to the instruction for recording from the host apparatus is complete.

(2) Data Processing at the Time of Data Reproducing

The data processing at the time of reproduction is carried out in a manner reversed to that at the time of recording. In other words, when the address information reproducing circuit (reproducing means) 100 detects an arrival of a frame corresponding to the logical sector specified by an instruction for reproducing from the host apparatus 200, the data demodulation circuit (demodulation means) 102, which is controlled by the controller 109, subjects reproducing channel bit strings from the 48 data segments following the address segment of the corresponding frame to a data demodulation process, and transmits the resulting data to the data RAM 106. Here, the controller 109 controls the data RAM 106 so that the data layout on the RAM 106 is returned to the previous data layout shown in FIG. 5. In other words, the controller (arranging means) 109 controls so that reproduced data from the leading four data segments of the corresponding frame is stored in the column addresses 1 to 198 at the row address 1 of the data RAM 106. Thereafter, reproduced data from the data segments is successively stored in the row addresses 2, 3, . . . , 12. Moreover, the control data added at the time of recording is extracted from the reproduced data that has been data-demodulated, and is used for address control at the time of storing the reproduced data in the data RAM 106.

With respect to the 16 frames corresponding to 16 logical sectors constituting the error correction block, the above-mentioned operations, that is, the data demodulation, extraction of the control data and storing of the data in the data RAM, are repeated so that the arrangement of the data and parities contained in one error correction block on the data RAM 106 is completed.

Next, the controller 109 controls the data RAM 106 and the error correction decoder circuit (decoding means) 105 so that they carry out an error correction decoding process on the user data and addition data stored in the data RAM 106. The first decoding process carries out a decoding process on each of the code sequences that have been encoded by the second encoding process at the time of recording. In other words, the controller 109 reads 172 bytes of data on row address 1 of the data RAM 106, 16 bytes of the first encoding parities and 10 bytes of the second encoding parities, and sends the resulting data to the error correction decoder circuit 105. The error correction decoder circuit 105 carries out a decoding process corresponding to the second encoding process at the time of recording. Then, upon detection of an error that is correctable, it corrects the error data on the data RAM 106. Moreover, in the case when no error is detected or when an error that is incorrectable is detected, it does not correct any data on the data RAM 106.

Thereafter, the controller 109 transmits data and the first and second encoding parities to the error correction decoder circuit 105 with respect to the respective row addresses 2, 3, . . . , 192 on the data RAM 106. The error correction decoder circuit 105 carries out a decoding process for every 198 bytes transmitted thereto, and corrects data on the data RAM 106, if necessary.

Upon completion of the first decoding process, the second decoding process is carried out. The second decoding process carries out a decoding process for each of the code sequences encoded by the first encoding process at the time of recording. In other words, the controller 109 reads 172 bytes of data and 16 bytes of the first encoding parities in a diagonal direction of the two-dimensional array represented by the row addresses 1 to 192 and the column addresses 1 to 188 of the data RAM 106, and transmits the data to the error correction decoder circuit 105. Here, in the first encoding process at the time of recording, each code sequence is constituted by a data alignment in a diagonal direction based upon the data positions (1, 1), (2, 1), (3, 1), . . . , (192, 1) in the two-dimensional array; thus, the second decoding process of the error correction decoder circuit 105 is carried out on each of the above-mentioned code sequences, and when any error that is correctable is detected, the data correction is carried out on the data RAM 106.

As described above, with respect to the data on the data RAM 106 that has been subjected to the first and second decoding processes, the controller 109 transmits the corresponding data to the host apparatus 200 through the interface circuit 107. Moreover, in the case when the number of logical sectors specified by the host apparatus 200 for reproducing still remains, the above-mentioned process related to the error correction blocks on a basis of 16 logical sectors is carried out several times so that the data processing operation corresponding to the instruction for reproducing from the host apparatus 200 is completed.

[Embodiment 2]

Referring to FIGS. 6(*a*) and 6(*b*), the following description will discuss Embodiment 2 of the present invention.

Here, in the same manner as Embodiment 1, an explanation will be given of a case in which the present invention is applied to a magneto-optical disk shown in FIG. 2 and FIGS. 3(a) and 3(b). Those members that have the same functions and that are described in Embodiment 1 are indicated by the same reference numerals; and the description thereof is omitted.

FIGS. 6(a) and 6(b) are explanatory drawings which relates to an error correction sequence of a recording format in the above-mentioned magneto-optical disk, and which shows an arrangement of a data block that constitutes a unit for an error-encoding process. Here, the size of the data block, the size of the logical sector and the first and second encoding processes are the same as those of Embodiment 1. Moreover, the arrangement in which the control code indicating the row number, etc. in the two-dimensional array is added to the leading portion of each row in the two-dimensional array (198 bytes×192 bytes) to which parities have been added is also provided in the same manner as FIG. 1 showing Embodiment 1.

FIG. 6(a) schematically shows a data block to which the second encoding process is applied in the same manner as Embodiment 1. Here, the present embodiment features that, as illustrated in FIG. 6(b), after the second encoding process, the parities P2 generated by the second encoding process are arranged in a dispersed manner.

In other words, in FIG. 6(b), the parities, which are generated by the second encoding process and which are indicated by the column numbers 189, 190, . . . , 198 in the two-dimensional array constituting the error correction block of FIG. 1 in Embodiment 1, are arranged in a dispersed manner in the respective column numbers 48, 49, 98, 99, 148, 149, 195, 196, 197 and 198. Here, in the present embodiment, the second encoding parities are arranged at least at column numbers 48, 49, 98, 99, 148, 149, 198, and each of the other second encoding parities may be placed at any row.

The data block (FIG. 6(b)) to which the above-mentioned error encoding parities and control codes have been added is divided into data segments as shown in FIG. 3(a), and recorded. In other words, each row of the two-dimensional array of the data block of FIG. 6(b) is divided into 4 data segments, and arranged; thus, data, parities and addition data corresponding to 12 rows are recorded in one frame.

In a magneto-optical disk having the above-mentioned recording format, data which is placed at an end of the data field of each data segment forms parity P2 which is generated by the second encoding process and which is placed at the leading control code in each row and a column number 48, 49, 98, 99, . . . , 198 (where column numbers are numbers that do not include control codes). Therefore, even when a magneto-optical disk 1 which might have a high error rate at the ends of a data field is used and when an incorrectable error subsequently occurs, it is possible to reduce the probability of error occurring in data transmitted from the host apparatus 200.

Here, since the code minimum distance of the Reed-Solomon code of the second encoding process is smaller than the code minimum distance of the Reed-Solomon code of the first encoding process, the correction capability is low. Moreover, the data alignment for carrying out the second encoding process is set along the recording direction onto the optical disk in the two-dimensional array; therefore, it is not possible to increase the correction capability. For this reason, as described in the present embodiment, the second encoding parities are arranged in a dispersed manner at the ends of each data segment. Thus, since the data constituting the code sequence for the first encoding process and the first encoding parities are not placed at the ends of each data segment, the code sequence for the first encoding process, which has a higher correction capability, is allowed to have a reduced probability of failure in the correction process.

As described above, in the same manner as Embodiment 1, the present embodiment also has the arrangement in which the first encoding process that forms a code sequence by using a data alignment in a diagonal direction and the second encoding process that forms a code sequence by using a data alignment in the row direction are carried out. However, the present embodiment is not intended to be limited by this arrangement, and any arrangement may be used as long as parities are placed at the ends of a data field DF. For example, the first encoding process may use a code sequence constituted by a data alignment in the row direction, with the second encoding process using a code sequence constituted by a data alignment in the column direction, so that the first encoding parities may be shifted to be placed on a column coinciding an edge of the data field DF. In this case, however, the second encoding parities corresponding to the first encoding parities to be shifted need to be shifted together with the first encoding parities.

Moreover, in the same manner as Embodiment 1, the present embodiment exemplifies a case in which, in order to allow the ends of the data fields DF to be concentrated on specific columns, the control code C is added so that, supposing that the number of data in the portion between the concave and convex areas (the number of data of the data field DF) is n (n: natural number), the length m of each row is represented by b×n (b: natural number). However, in the present embodiment, it is only necessary to place the parities at the ends of the data fields DF, and it is not necessary to allow the ends of the data fields DF to be concentrated on specific columns. Nevertheless, when the ends of the data fields DF are concentrated on specific columns, it is possible to make the process easier since the parities can be shifted on a column basis.

Additionally, in order to arrange the data to be recorded on ends of the data field DF so as to be concentrated on specific rows, the length m of each row may be represented by b×n=a×m (a: natural number). Here, in an attempt to allow data related to one logical sector to complete within a plurality of rows, that is, to prevent data related to one logical sector from being placed on the same row, supposing that the number of data related to one logical sector is l bytes (l: natural number greater than m), l=c×m (c: natural number) needs to be satisfied. In this case, the data corresponding to one logical sector is completed within c rows. Moreover, supposing that the minimum combination of a and b that satisfies b×n=a×m are $a_{min}$ and $b_{min}$, it is preferable to set $a_{min}$ to a divisor of c that is smaller than c.

Next, an explanation will be given of a magneto-optical disk recording and reproducing apparatus which realizes the recording method of the present embodiment. In this magneto-optical recording and reproducing apparatus is the same as the magneto-optical recording and reproducing apparatus (FIG. 4) explained in Embodiment 1. Therefore, with respect to the same arrangements as those of Embodiment 1, the description thereof is omitted or simplified.

(1) Data Processing at the Time of Data Recording

With respect to the recording and reproducing data processing in the magneto-optical disk recording and reproducing apparatus, the data transfer process from the host apparatus 200 at the time of recording and the data processing related to the first and second encoding processes are the same as those of Embodiment 1. Therefore, after the second encoding process has been carried out, the resulting data on the data RAM 100 and the layout of the first and second encoding parities are the same as those shown in FIG. 5.

The present embodiment is different from Embodiment 1 in that, when recording is made on the frame corresponding to the logical sector which is specified by the host apparatus 200 for recording with respect to data and parities in the data RAM 106, the sequence of transmission of the data and parities to the data modulation circuit 101, which is controlled by the controller 109, is carried out in a different manner.

More specifically, with respect to the data and parities corresponding to 16 logical sectors stored in the data RAM 106, when the address information reproducing circuit 100 detects an arrival of the frame corresponding to the first logical sector, the controller 109 controls the control code circuit 108 so that a control code (2 bytes) is sent to the data modulation circuit 101. Successively, the controller 109 sends data and parities on row address 1 of the data RAM 106 to the data modulation circuit 101 in the following sequence: data (47 bytes) of column address 1 to 47, the second encoding parities of column addresses 189 and 190, data of column addresses 48 to 95, the second coding parities of column addresses 191 and 192, data of column addresses 96 to 143, the second encoding parities of column addresses 193 and 194, data and the first encoding parities of addresses 144 to 188, and the second encoding parities of column addresses 195 to 198.

The data modulation circuit 101, which is controlled by the controller 109, divides control codes, data and parities outputted in the above-mentioned order into four, and subjects these to a data modulation process on a basis of 50 bytes; thus, the resulting recording data bit strings are sent to the magnetic head driving circuit 18 so as to be recorded in data fields within the four data segments following the address segment of the frame corresponding to the first logical sector.

Thereafter, the controller 109 controls the control code circuit 108 and the data RAM 106 so that it successively sends the control codes corresponding to the row numbers 2, 3, . . . , 12 in the two-dimensional array constituting the error correction block stored in the data RAM 106 and data and parities of row addresses 2, 3, . . . , 12 of the data RAM 106 to the data modulation circuit 101, in the same manner as the above-mentioned transmission on row address 1. The data modulation circuit 101 divides the control code, data and parities on a row basis, and carries out a modulation process thereon, thereby sending the resulting recording channel bit strings to the magnetic head driving circuit 18.

With respect to the second logical sector of the 16 logical sectors and thereafter, the above-mentioned processes are repeated so that the data process related to one error correction block is completed.

(2) Data Processing at the Time of Data Reproducing

The data processing at the time of reproduction is carried out in a manner reversed to that at the time of recording. In other words, when the address information reproducing circuit 100 detects an arrival of a frame corresponding to the logical sector specified by an instruction for reproducing from the host apparatus 200, the data demodulation circuit (demodulation means) 102, which is controlled by the controller 109, subjects reproducing channel bit strings from the 48 data segments following the address segment of the corresponding frame to a data demodulation process, and transmits the resulting data to the data RAM 106.

Here, the controller 109 controls the data RAM 106 so that the data layout on the RAM 106 is returned to the previous data layout shown in FIG. 5. In other words, upon storing reproduced data from the leading four data segments of the corresponding frame in column addresses 1 to 198 at row address 1 of the data RAM 106, the controller 109 extracts the second encoding parities so as to successively store them from column address 189 in the data RAM 106, and also stores data and the first encoding parities from column address 1 in the data RAM 106.

Thereafter, in the same manner, reproduced data from the data segments is successively stored in the row addresses 2, 3, . . . , 12. Here, in the same manner as Embodiment 1, the control data added at the time of recording is extracted from the reproduced data that have been data-demodulated.

With respect to the 16 frames corresponding to 16 logical sectors constituting the error correction block, the above-mentioned operations, that is, the data demodulation, extraction of the control data and storing of the data in the data RAM, are repeated so that the arrangement of the data and parities contained in one error correction block on the data RAM 106 is completed.

After the process of the controller 109 for controlling the error correction encoding process for the user data and addition data stored in the data RAM 106, the same processes as those of Embodiment 1 are carried out.

In the above-mentioned embodiments 1 and 2, row numbers of the two-dimensional array constituting the error correction block are recorded as the control codes C. The control codes C may include codes for indicating the numbers of the data segments in which the corresponding control codes are recorded in the frame. This arrangement makes it possible to easily confirm the position of a segment currently being scanned by the light beam in the frame, and consequently to easily detect the frame address after the accessing process, etc.

Moreover, in the above-mentioned embodiments 1 and 2, a magneto-optical disk of the sample serve system is used; however, the present invention is not intended to be limited by this. In other words, the present invention may also be applied to an optical disk in which clock marks, formed on a track as concave and convex sections with constant intervals, serve as a means for recording data in a dispersed manner between areas formed by concave and convex sections on the optical disk substrate.

Figure 7:
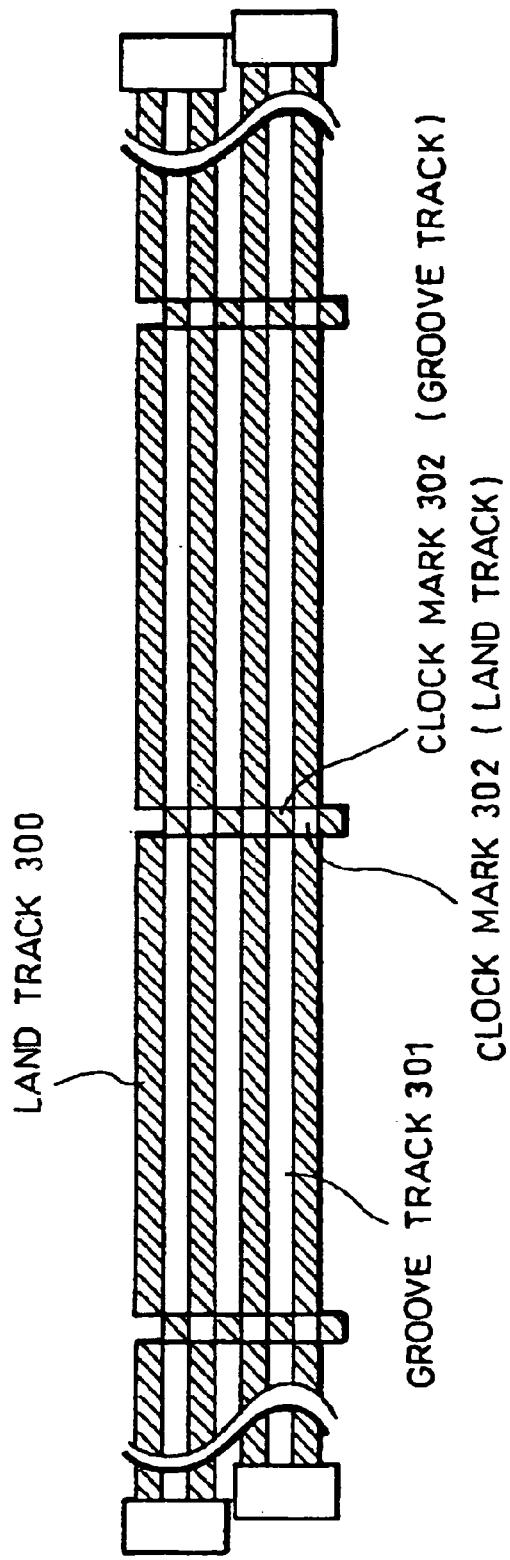
FIG. 7 is an explanatory drawing that shows a segment layout of an optical disk that is applicable to the error correction method shown in FIG. 1 and FIGS. 6($a$) and 6($b$).
Figure 8:
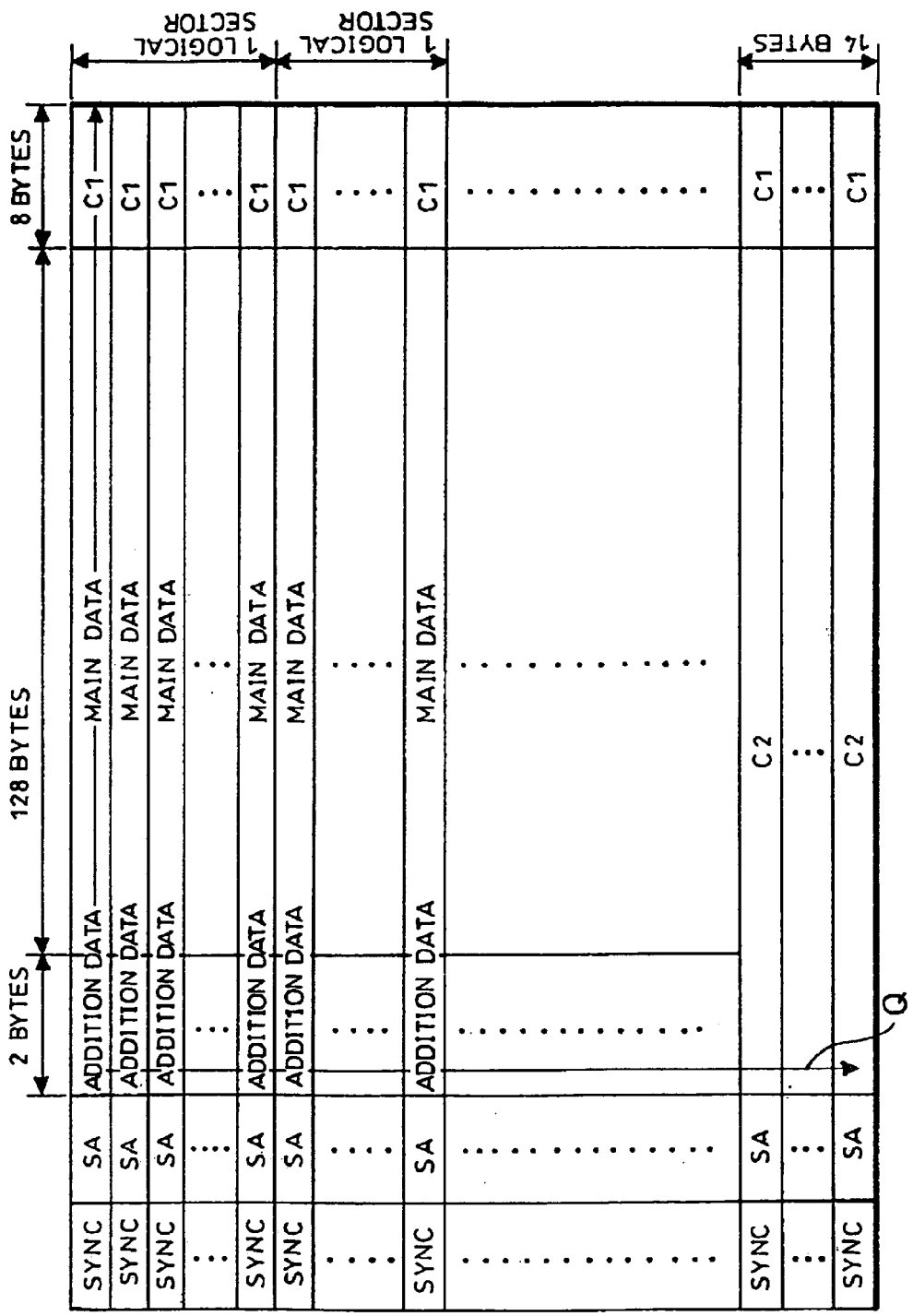
FIG. 8 is an explanatory drawing that shows a conventional information recording method for error correction.

FIG. 7 is an explanatory drawing that shows the layout of segments on an optical disk having clock marks formed on the track as concave and convex sections with constant intervals. In this optical disk, both of a land track (land portion) 300 and a groove track (groove portion) 301 constituting a guiding groove formed on the optical disk substrate as concave and convex sections are utilized as recording tracks; that is, data is recorded between clock marks 302 that are placed with constant intervals on the land track 300 or the groove track 301.

Moreover, the two-dimensional array of data in Embodiments 1 and 2 is virtually arranged array, and actually, the data is not necessarily arranged in this manner. For example, in Embodiment 2, as illustrated in FIG. 6(*b*), the second encoding parities are shifted on a column basis so as to be two-dimensionally arranged. However, this shift is realized by changing the data transferring order as described earlier, and the two-dimensional array of the present invention includes this type of arrangements.

Moreover, in the above-mentioned Embodiments 1 and 2, two error correction encoding processes are carried out; however, more error correction encoding processes may be carried out. Moreover, in Embodiment 2, the second encoding process is carried out on each row in the lateral direction in the two-dimensional array that has been subjected to the first encoding process with respect to the data alignment in the diagonal direction of the two-directional array; however, a single error correction encoding process, such as the encoding process with respect to the data alignment in the diagonal direction of the two-dimensional array or the encoding process with respect to the data alignment in the lateral direction (row direction) of the two-dimensional array, may be carried out on the two-dimensional array.

In the recording method of an optical disk in accordance with the present invention, as described in Embodiment 1, upon recording information on an optical disk having data recording areas between concave and convex sections, the two-dimensional array used in the error-correction encoding process is arranged so that a specific column of data and parity is placed on the ends of a recording area in a concentrated manner, and an error-correction encoding process using a coding system aligned in a diagonal direction of the data array is carried out.

Therefore, data and parities placed on the ends of each area formed as concave and convex areas on the optical disk substrate are dispersed. Consequently, when an optical disk and an optical disk recording and reproducing device which might have a high error rate at the ends of the recording area are used, the application of the error-correction decoding process at the time of playback makes it highly possible that the error correction is made, thereby improving the reliability in recording data.

Moreover, as described in Embodiment 2, the recording method of an optical disk in accordance with the present invention relates to a method for arranging parities on the ends of concave and convex area (data recording areas) formed on the optical disk substrate.

Therefore, the ends of the data recording areas contain no data that is to be sent from the host apparatus, and recorded. Consequently, even when an optical disk which might have a high error rate at the ends of a recording area adjacent to the concave and convex areas is used, and even in the event of an error in the optical disk recording and reproducing apparatus, it is possible to reduce the probability of the occurrence of an error in important data sent from the host apparatus.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A recording method for an optical disk, which is used for an optical disk in which concave and convex areas formed as concave and convex sections on the disk substrate are arranged along a track with constant intervals, wherein the optical disk includes a recording area for recording data for a predetermined number of units n (n: natural number), the recording area placed between the concave and convex areas arranged with constant intervals, the recording method comprising the steps of:

forming a first two-dimensional array by adding addition data to input data;

forming a second two-dimensional array in which the length of each row is set to m (m: natural number) with a×m=b n (a, b: natural numbers) being satisfied, by carrying out a plurality of error-correction encoding processes, including at least an error-correction encoding process that forms a code sequence by using a data alignment in a diagonal direction of the first two-dimensional array, on the first two-dimensional array; and successively sending data on each row in the second two-dimensional array so that all the data in the second two-dimensional array is recorded on the recording area on the optical disk.

2. The recording method for an optical disk as defined in claim 1, wherein an addition code having a length satisfying the equation a×m=b×n (a, b: natural numbers) in the second two-dimensional array is added to each row of the second two-dimensional array.

3. The recording method for an optical disk as defined in claim 1, wherein: supposing that the number of data related to one logical sector is l byte (l: natural number greater than m), l=c×m (c: natural number) is satisfied and supposing that the minimum combination of a and b that satisfies a×m=b×n are $a_{min}$ and $b_{min}$ is set to a divisor of c that is smaller than c.

4. A recording method for an optical disk, which is used for an optical disk in which concave and convex areas formed as concave and convex sections on the disk substrate are arranged along a track with constant intervals, wherein the optical disk includes a recording area for recording data of a predetermined number of units (n: natural number), the recording area placed between the concave and convex areas arranged with constant intervals, the recording method comprising the steps of:

forming a first two-dimensional array by adding addition data to input data;

forming a third two-dimensional array having the number of data contained in one row that does not exceed the number of rows by carrying out an error-correction encoding process on the first two-dimensional array by using a code sequence constituted by a data alignment in a diagonal direction so as to add a row constituted by a first encoding parity to the first two-dimensional array;

forming a second two-dimensional array in which the length of each row is set to m (m: natural number) with a×m=b×n (a, b: natural numbers) being satisfied by carrying out an error-correction encoding process on the third two-dimensional array by using a code sequence constituted by a data alignment in a row direction so as to add a second encoding parity to the third two-dimensional array; and successively sending data on each row in the second two-dimensional array so that all the data in the second two-dimensional array is recorded on the recording area on the optical disk.

5. The recording method for an optical disk as defined in claim 4, wherein an addition code having a length satisfying the equation a×m=b×n (a, b: natural numbers) in the second two-dimensional array is added to each row of the second two-dimensional array.

6. The recording method for an optical disk as defined in claim 4, wherein: supposing that the number of data related to one logical sector is l byte (l: natural number greater than m), l=c×m (c: natural number) is satisfied and supposing that the minimum combination of a and b that satisfies a×m=b×n are $a_{min}$ and $b_{min}$, $a_{min}$ is set to a divisor of c that is smaller than c.

7. A recording method for an optical disk, which is used for an optical disk in which concave and convex area formed as concave and convex sections on the disk substrate are arranged along a track with constant intervals wherein the optical disk includes a recording area for recording data of a predetermined number of units n (n: natural number), the recording area placed between the concave and convex areas arranged with constant intervals, the recording method comprising the steps of:

forming a first two-dimensional array by adding addition data to input data;

forming a second two-dimensional array by carrying out a single error-correction encoding process or a plurality of error-correction encoding processes which form code sequences by using data alignments in respectively different directions of the first two-dimensional array on the first two-dimensional array; and successively sending data on the respective rows in the second two-dimensional array while exchanging the data so as to record a parity generated in at least any one of the error-encoding processes on a portion adjacent to the concave and convex areas in the recording area, thereby recording all the data in the second two-dimensional array on the recording area on the optical disk.

8. The recording method for an optical disk as defined in claim 7, further comprising the step of:

carrying out on the first two-dimensional array a plurality of error-correcting encoding processes including an error-correction encoding process that forms a code sequence by using a data alignment in a recording direction of data onto the optical disk in the second two-dimensional array, wherein a parity, which has been generated in an error-correction encoding process that forms a code sequence by using a data alignment in a recording direction of data on the optical disk in the second two-dimensional array, is recorded on the portion adjacent to the concave and convex areas in the recording area.

9. The recording method for an optical disk as defined in claim 7, further comprising the step of:

carrying out a plurality of error-correcting encoding processes on the first two-dimensional array, wherein a parity, formed by the error-correction encoding process having a short minimum distance of codes among the plurality of error encoding processes, is preferentially recorded on the portion adjacent to the concave and convex areas in the recording area.

10. The recording method for an optical disk as defined in claim 7, wherein the second two-dimensional array has a length of each row that is set to m (m: natural number), with $a \times m = b \times n$ (a, b: natural numbers) being satisfied.

11. The recording method for an optical disk as defined in claim 10, wherein an addition code having a length satisfying the equation $a \times m = b \times n$ (a, b: natural numbers) in the second two-dimensional array is added to each row of the second two-dimensional array.

12. The recording for an optical disk as defined in claim 10, wherein: supposing that the number of data related to one logical sector is 1 byte (1: natural number greater than m), $1 = c \times m$ (c: natural number) is satisfied and supposing that the minimum combination of a and b that satisfies $a \times m = b \times n$ are $a_{min}$ and $b_{min}$, $a_{min}$ is set to a divisor of c that is smaller than c.

13. An optical disk recording apparatus, which records information on an optical disk in which concave and convex areas formed as concave and convex sections on the disk substrate are arranged along a track with constant intervals, wherein:

the optical disk includes a recording area for recording data of a predetermined number of units n (n: natural number), the recording area placed between the concave and convex areas arranged with constant intervals, the optical disk recording apparatus comprising:

encoding means for forming a first two-dimensional array by adding addition data to input data, for carrying out a plurality of error-correction encoding processes on the first two-dimensional array, the encoding processes including at least an error-correction encoding process that forms a code sequence by using a data alignment in a diagonal direction of the first two-dimensional array, and for forming a second two-dimensional array in which the length of each row is set to m (m: natural number) with $a \times m = b \times n$ (a, b: natural numbers) being satisfied;

modulation means for successively modulating data in each row in the second two-dimensional array; and recording means for recording the modulated data on the recording area of the optical disk.

14. An optical disk recording apparatus, which records information on an optical disk in which concave and convex areas formed as concave and convex sections on the disk substrate are arranged along a track with constant intervals, wherein the optical disk includes a recording area for recording data of a predetermined number of units n (n: natural number), the recording area placed between the concave and convex areas arranged with constant intervals, the optical disk recording apparatus comprising:

encoding means for forming a first two-dimensional array by adding addition data to input data, for carrying out a single error-correction encoding process or a plurality of error-correction encoding processes which form code sequences by using data alignments in respectively different directions of the first two-dimensional array on the first two-dimensional array so that a second two-dimensional array is formed;

modulation means for carrying out a data modulation while exchanging the data so as to record a parity generated in at least any one of the error-encoding processes on a portion adjacent to the concave and convex areas in the recording area; and recording means for recording the modulated data on the recording area of the optical disk.

15. An optical disk reproducing apparatus, which reproduces information from an optical disk in which concave and convex areas formed as concave and convex sections on the disk substrate are arranged along a track with constant intervals, wherein:

the optical disk includes a recording area for recording data of a predetermined number of units n (n: natural number), the recording area placed between the concave and convex areas arranged with constant intervals, the optical disk being provided with an arrangement in which: a first two-dimensional array is formed by adding addition data to input data, a plurality of error-correction encoding processes, including at least an error-correction encoding process that forms a code sequence by using a data alignment in a diagonal direction of the first two-dimensional array, are carried out on the first two-dimensional array, a second two-dimensional array in which the length of each row is set to m (m: natural number) with $a \times m = b \times n$ (a, b: natural numbers) being satisfied is formed, and data on each row in the second two-dimensional array are sent so that all the data in the second two-dimensional array are recorded on the recording area on the optical disk, the optical disk reproducing apparatus comprising reproducing means for reading data from the recording area;

demodulation means for demodulating data read by the reproducing means;

arranging means for arranging the demodulated data from the demodulation means into the second two-dimensional array; and decoding means for carrying out decoding processes on the plurality of error-correction encoding processes with respect to the data arranged in the second two-dimensional array.

16. An optical disk reproducing apparatus, which reproduces information from an optical disk in which concave and convex areas formed as concave and convex sections on the disk substrate are arranged along a track with constant intervals wherein:

the optical disk includes a recording area for recording data of a predetermined number of units n (n: natural number), the recording area placed between the concave and convex areas arranged with constant intervals, the optical disk being provided with an arrangement in which: a first two-dimensional array is formed by adding addition data to input data, a single error-correction encoding process or a plurality of error-correction encoding processes which form code sequences by using data alignments in respectively different directions of the first two-dimensional array on the first two-dimensional array are carried out so that a second two-dimension array is formed, and data are successively recorded while exchanging the data in each row in the second two-dimensional array so as to record a parity generated in at least any one of the error-encoding processes on a portion adjacent to the concave and convex areas in the recording area;

the optical disk reproducing apparatus comprising:

reproducing means for reading data from the recording area;

demodulation means for demodulating data read by the reproducing means;

arrangement means for successively arranging the demodulated data from the demodulation means into the second two-dimensional array, while exchanging positions of the parities; and decoding means for carrying out decoding processes on the error-correction encoding processes with respect to the data arranged in the second two-dimensional array.

17. An optical disk, comprising concave and convex areas that are formed as concave and convex sections on the disk substrate and arranged along a track with constant intervals, the optical disk comprising:

a recording area for recording data of a predetermined number of units n (n: natural number) that is placed between the concave and convex areas arranged with constant intervals, wherein: a first two-dimensional array is formed by adding addition data to input data, a plurality of error-correction encoding processes, including at least an error-correction encoding process that forms a code sequence by using a data alignment in a diagonal direction of the first two-dimensional array, are carried out on the first two-dimensional array so that a second two-dimensional array in which the length of each row is set to m (m: natural number) with a X m=b×n (a, b: natural numbers) being satisfied is formed, and data on each row in the second two-dimensional array is successively recorded in the second two-dimensional array so that all the data in the second two-dimensional array is recorded on the recording area on the optical disk.

18. An optical disk, comprising: concave and convex areas that are formed as concave and convex sections on the disk substrate, and arranged along a track with constant intervals, and the optical disk comprising:

a recording area for recording data of a predetermined number of units n (n: natural number) that is placed between the concave and convex areas arranged with constant intervals, wherein: a first two-dimensional array is formed by adding addition data to input data, a single error-correction encoding process or a plurality of error-correction encoding processes which form code sequences by using data alignments in respectively different directions of the first two-dimensional array on the first two-dimensional array are carried out so that a second two-dimensional array is formed, and data is successively recorded while exchanging the data in each row in the second two-dimensional array so as to record a parity generated in at least any one of the error-encoding processes on a portion adjacent to the concave and convex areas in the recording area, so that all the data in the second two-dimensional array is recorded.

19. A recording method for an optical disk, which is used for an optical disk in which concave and convex areas formed as concave and convex sections on the disk substrate are arranged along a track with constant intervals, wherein:

the optical disk includes a recording area for recording data of a predetermined number of units n (n: natural number), the recording area placed between the concave and convex areas arranged with constant intervals, and a data block, which is a unit of an error-correction encoding process, consists of a plurality of logical sectors, each of which is constituted by plural data segments, each of which is formed by the concave and convex areas and the recording area, the recording method comprising the steps of:

forming a first two-dimensional array by adding addition data to input data;

forming a second two-dimensional array in which the length of each row is set to m (m: natural number) with a×m=b×n (a, b: natural numbers) being satisfied, by carrying out a plurality of error-correction encoding processes, including at least an error-correction encoding process that forms a code sequence by using a data alignment in a diagonal direction of the first two-dimensional array, on the first two-dimensional array; and successively sending data on each row in the second two-dimensional array so that all the data in the second two-dimensional array is recorded on the recording area on the optical disk.

20. A recording method for an optical disk, which is used for an optical disk in which concave and convex areas formed as concave and convex sections on the disk substrate are arranged along a track with constant intervals, wherein the optical disk includes a recording area for recording data of a predetermined number of units n (n: natural number), the recording area placed between the concave and convex areas arranged with constant intervals, and a data block, which is a unit of an error-correction encoding process, consists of a plurality of logical sectors, each of which is constituted by plural data segments, each of which is formed by the concave and convex areas and the recording area, the recording method comprising the steps of:

forming a first two-dimensional array by adding addition data to input data;

forming a third two-dimensional array having the number of data contained in one row that does not exceed the number of rows by carrying out an error-correction encoding process on the first two-dimensional array by using a code sequence constituted by a data alignment in a diagonal direction so as to add a row constituted by a first encoding parity to the first two-dimensional array;

forming a second two-dimensional array in which the length of each row is set to m (m: natural number) with a×m=b×n (a, b: natural numbers) being satisfied by carrying out an error-correction encoding process on the third two-dimensional array by using a code sequence constituted by a data alignment in a row direction so as to added a second encoding parity to the third two-dimensional array; and successively sending data on each row in the second two-dimensional array so that all the data in the second two-dimensional array is recorded on the recording area on the optical disk.

21. A recording method for an optical disk, which is used for an optical disk in which concave and convex areas formed as concave and convex sections on the disk substrate are arranged along a track with constant intervals wherein:

the optical disk includes a recording area for recording data of a predetermined number of units n (n: natural number), the recording area placed between the concave and convex areas arranged with constant intervals, and a data block, which is a unit of an error-correction encoding process, consists of a plurality of logical sectors, each of which is constituted by plural data segments, each of which is formed by the concave and convex areas and the recording area, the recording method comprising the steps of:

forming a first two-dimensional array by adding addition data to input data; and forming a second two-dimensional array by carrying out a single error-correction encoding process or a plurality of error-correction encoding processes which form code sequences by using data alignments in respectively different directions of the first two-dimensional array on the first two-dimensional array; and successively sending data on the respective rows in the second two-dimensional array while exchanging the data so as to record a parity generated in at least any one of the error-encoding processes on a portion adjacent to the concave and convex areas in the recording area, thereby recording all the data in the second two-dimensional array on the recording area on the optical disk.

22. An optical disk recording apparatus, which records information on an optical disk in which concave and convex areas formed as concave and convex sections on the disk substrate are arranged along a track with constant intervals, wherein:

the optical disk includes a recording area for recording data of a predetermined number of units n (n: natural number), the recording area placed between the concave and caonvex areas arranged with constant intervals, and a data block, which is a unit of an error-correction encoding process, consists of a plurality of logical sectors, each of which is constituted by plural data segments, each of which is formed by the concave and convex areas and the recording area, the optical disk recording apparatus comprising:

encoding means for forming a first two-dimensional array by adding addition data to input data, for carrying out a plurality of error-correction encoding processes on the first two-dimensional array, the encoding processes including at least an error-correction encoding process that forms a code sequence by using a data alignment in a diagonal direction of the first two-dimensional array, and for forming a second two-dimensional array in which the length of each row is set to m (m: natural number) with a×m=b×n (a, b: natural numbers) being satisfied;

modulation means for successively modulating data in each row in the second two-dimensional array; and recording means for recording the modulated data on the recording area of the optical disk.

23. An optical disk recording apparatus, which records information on an optical disk in which concave and convex area formed as concave and convex sections on the disk substrate are arranged along a track with constant intervals and a recording area for recording data of a predetermined number of units n (n: natural number) is placed between the concave and convex areas arranged with constant intervals, wherein the optical disk includes a recording area for recording data of a predetermined number of units n (n: natural number), the recording area placed between the concave and caonvex areas arranged with constant intervals, and a data block, which is a unit of an error-correction encoding process, consists of a plurality of logical sectors, each of which is constituted by plural data segments, each of which is formed by the concave and convex area and the recording area, the optical disk recording apparatus comprising:

encoding means for forming a first two-dimensional array by adding addition data to input data, for carrying out a single error-correction encoding process or a plurality of error-correction encoding processes which form code sequences by using data alignments in respectively different directions of the first two-dimensional array on the first two-dimensional array so that a second two-dimensional array is formed;

modulation means for carrying out a data modulation while exchanging the data so as to record a parity generated in at least any one of the error-encoding processes on a portion adjacent to the concave and convex areas in the recording area; and recording means for recording the modulated data on the recording area of the optical disk.

24. An optical disk reproducing apparatus, which reproduces information from an optical disk in which concave and convex areas formed as concave and convex sections on the disk substrate are arranged along a track with constant intervals, wherein:

the optical disk includes a recording area for recording data of a predetermined number of units n (n: natural number), the recording area placed between the concave and convex areas arranged with constant intervals;

a data block, which is a unit of an error-correction encoding process, consists of a plurality of logical sectors, each of which is constituted by plural data segments, each of which is formed by the concave and convex areas and the recording area; and the optical disk being provided with an arrangement in which: a first two-dimensional array is formed by adding addition data to input data, a plurality of error-correction encoding processes, including at least an error-correction encoding process that forms a code sequence by using a data alignment in a diagonal direction of the first two-dimensional array, are carried out on the first two-dimensional array, a second two-dimensional array in which the length of each row is set to m (m: natural number) with a×m=b×n (a, b: natural numbers) being satisfied is formed, and data on each row in the second two-dimensional array are sent so that all the data in the second two-dimensional array are recorded on the recording area on the optical disk, the optical disk reproducing apparatus comprising:

reproducing means for recording data from the recording area;

demodulation means for demodulating data read by the reproducing means;

arranging means for arranging the demodulated data from the demodulation means into the second two-dimensional array; and decoding means for carrying out decoding processes on the plurality of error-correction encoding processes with respect to the data arranged in the second two-dimensional array.

25. An optical disk reproducing apparatus, which reproduces information from an optical disk in which concave and convex areas formed as concave and convex sections on the disk substrate are arranged along a track with constant intervals wherein:

the optical disk includes a recording area for recording data of a predetermined number of units n (n: natural number), the recording area placed between the concave and convex areas arranged with constant intervals;

a data block, which is a unit of an error-correction encoding process, consists of a plurality of logical sectors, each of which is constituted by plural data segments, each of which is formed by the concave and convex areas and the recording area; and the optical disk being provided with an arrangement in which: a first two-dimensional array is formed by adding addition data to input data, a single error-correction encoding process or a plurality of error-connection encoding processes which form code sequences by using data alignments in respectively different directions of the first two-dimensional array on the first two-dimensional array are carried out so that a second two-dimensional array is formed, and data are successively recorded while exchanging the data in each row in the second two-dimensional array so as to record a parity generated in at least any one of the error-encoding processes on a portion adjacent to the concave and convex areas in the recording area;

the optical disk reproducing apparatus comprising:

reproducing means for reading data from the recording area;

demodulation means for demodulating data read by the reproducing means;

arranging means for successively arranging the demodulated data from the demodulation means into the second two-dimensional array, while exchanging positions of the parities; and decoding means for carrying out decoding processes on the error-correction encoding processes with respect to the data arranged in the second two-dimensional array.

26. A recording method for an optical disk, which is used for an optical disk in which concave and convex areas formed as concave and convex sections on the disk substrate are arranged along a track with constant intervals and a recording area for recording data of a predetermined number of units n (n: natural number) is placed between the concave and convex areas arranged with constant intervals, comprising the steps of:

forming a first two-dimensional array by adding addition data to input data;

forming a second two-dimensional array in which the length of each row is set to m (m: natural number) with a×m=b×n (a, b: natural numbers) being satisfied, by carrying out a plurality of error-correction encoding processes, including at least an error-correction encoding process that forms a code sequence by using a data alignment in a diagonal direction of the first two-dimensional array, on the first two-dimensional array; and successively sending data on each row in the second two-dimensional array so that all the data in the second two-dimensional array is recorded on the recording area on the optical disk, wherein, supposing that the number of data related to one logical sector is 1 byte (1: natural number greater than m), 1=c×m (c: natural number) is satisfied and supposing that the minimum combination of a and b that satisfies a×m=b×n are $a_{min}$ and $b_{min}$, $a_{min}$ is set to a divisor of c that is smaller than c.

27. A recording method for an optical disk, which is used for an optical disk in which concave and convex areas formed as concave and convex sections on the disk substrate are arranged along a track with constant intervals and a recording area for recording data of a predetermined number of units n (n: natural number) is placed between the concave and convex areas arranged with constant intervals, comprising the steps of:

forming a first two-dimensional array by adding addition data to input data;

forming a third two-dimensional array having the number of data contained in one row that does not exceed the number of rows by carrying out an error-correction encoding process on the first two-dimensional array by using a code sequence constituted by a data alignment in a diagonal direction so as to add a row constituted by a first encoding parity to the first two-dimensional array;

forming a second two-dimensional array in which the length of each row is set to m (m: natural number) with a×m=b×n (a, b: natural numbers) being satisfied by carrying out an error-correction encoding process on the third two-dimensional array by using a code sequence constituted by a data alignment in a row direction so as to add a second encoding parity to the third two-dimensional array; and successively sending data on each row in the second two-dimensional array so that all the data in the second two-dimensional array is recorded on the recording area on the optical disk, wherein, supposing that the number of data related to one logical sector is 1 byte (1: natural number greater than m), 1=c×m (c: natural number) is satisfied and supposing that the minimum combination of a and b that satisfies a×m=b×n are $a_{min}$ and $b_{min}$, $a_{min}$ is set to a divisor of c that is smaller than c.

28. A recording method for an optical disk, which is used for an optical disk in which concave and convex areas formed as concave and convex sections on the disk substrate are arranged along a track with constant intervals and a recording area for recording data of a predetermined number of units n (n: natural number) is placed between the concave and convex areas arranged with constant intervals, comprising the steps of:

- forming a first two-dimensional array by adding addition data to input data;
- forming a second two-dimensional array by carrying out a single error-correction encoding process or a plurality of error-correction encoding processes which form code sequences by using data alignments in respectively different directions of the first two-dimensional array on the first two-dimensional array; and
- successively sending data on the respective rows in the second two-dimensional array while exchanging the data so as to record a parity generated in at least any one of the error-encoding processes on a portion adjacent to the concave and convex areas in the recording area, thereby recording all the data in the second two-dimensional array on the recording area on the optical disk,
- wherein the second two-dimensional array has a length of each row that is set to m (m: natural number), with a×m=b×n (a, b: natural numbers) being satisfied and wherein,
- supposing that the number of data related to one logical sector is 1 byte (1: natural number greater than m), 1=c×m (c: natural number) is satisfied and supposing that the minimum combination of a and b that satisfies a×m=b×n are $a_{min}$ and $b_{min}$, $a_{min}$ is set to a divisor of c that is smaller than c.

* * * * *